US012685019B2

(12) United States Patent
    Mikhaeel et al.

(10) Patent No.:  US 12,685,019 B2
(45) Date of Patent:  Jul. 14, 2026

(54) OBTAINING HIGH COEFFICIENT OF PERFORMANCE IN HEATING OR COOLING BY USING THERMOELECTRIC MODULE(S)

(71) Applicant: Atieva, Inc., Newark, CA (US)

(72) Inventors: Mina Michel Kamel Mikhaeel, Hayward, CA (US); Wulfer Adrijan de Bruijn, San Carlos, CA (US)

(73) Assignee: Atieva, Inc., Newark, CA (US)

( * ) Notice: Subject to any disclaimer, the term of this patent is extended or adjusted under 35 U.S.C. 154(b) by 271 days.

(21) Appl. No.: 18/453,612

(22) Filed: Aug. 22, 2023

(65) Prior Publication Data

US 2025/0072287 A1    Feb. 27, 2025

(51) Int. Cl.
    H10N 10/13        (2023.01)
    H10N 10/17        (2023.01)

(52) U.S. Cl.
    CPC ............. H10N 10/13 (2023.02); H10N 10/17 (2023.02)

(58) Field of Classification Search
    CPC ................. B60H 1/00478; F25B 21/04; F25B 2321/025; F25B 2321/0252; F25B 25/005; F25B 2500/09; F28F 3/12; H10N 10/17
    See application file for complete search history.

(56) References Cited

U.S. PATENT DOCUMENTS

| 7,293,416 B2 | 11/2007 | Ghoshal | |
| 10,865,702 B2 * | 12/2020 | Bellato | ................. H10N 10/13 |

| 2012/0247526 A1 * | 10/2012 | Okuda | ................... H10N 10/13 |
| | | | 136/201 |
| 2013/0152989 A1 | 6/2013 | Krinn et al. | |
| 2016/0003502 A1 * | 1/2016 | Zelissen | ................. H10N 10/17 |
| | | | 62/3.3 |
| 2016/0036104 A1 * | 2/2016 | Kenney | ..................... F28F 3/12 |
| | | | 165/170 |
| 2017/0018825 A1 * | 1/2017 | Grünwald | ............... F25B 21/04 |
| 2018/0071425 A1 * | 3/2018 | Jin | ........................... A61L 9/035 |
| 2019/0293323 A1 * | 9/2019 | Quisenberry | ........... F25B 21/04 |
| 2023/0105915 A1 * | 4/2023 | Fu | ........................... F24F 1/031 |
| | | | 62/3.2 |

FOREIGN PATENT DOCUMENTS

KR        20030082589 A        10/2003

OTHER PUBLICATIONS

International Search Report and Written Opinion for PCT Application No. PCT/US2024/043227, mailed on Nov. 7, 2024, 14 pages.
Fernandez-Yanez, et al., "Thermal Analysis of a Thermoelectric Generator for Light-Duty Diesel Engines", Applied Energy 226, 2018, pp. 690-702.

(Continued)

*Primary Examiner* — Filip Zec
(74) *Attorney, Agent, or Firm* — Brake Hughes Bellermann LLP

(57)        ABSTRACT

A device comprises: a first fluid channel for a first fluid, the first fluid channel including first barriers; a second fluid channel for a second fluid, the second fluid channel including second barriers; and a thermoelectric module between the first and second fluid channels, the thermoelectric module thermally coupled to each of the first and second fluid channels.

20 Claims, 14 Drawing Sheets

(56) References Cited

OTHER PUBLICATIONS

Kim, et al., "Correlations And Optimization of a Heat Exchanger With Offset-Strip Fins", International Journal of Heat and Mass Transfer 54, 2011, pp. 2073-2079.

Ferrotec USA, "Thermoelectric Modules: A Guide to Thermoelectrics," available online at <https://web.archive.org/web/20221024191558/https:/thermal.ferrotec.com/technology/> published on Oct. 24, 2022, 4 pages.

Ferrotec USA, "Thermoelectric Technical Reference: 11.0 Mathematical Modeling of Thermoelectric Cooling Modules," available online at <https://web.archive.org/web/20230129084618/https://thermal.ferrotec.com/technology/thermoelectric-reference-guide/thermalref11/> published on Jan. 29, 2023, 9 pages.

R. M. Manglik et al.: "Heat Transfer and Pressure Drop Correlations for the Rectangular Offset Strip Fin Compact Heat Exchanger," Experimental Thermal and Fluid Science, vol. 10, 1995, pp. 171-180.

TE Technology, Inc., available online at <https://web.archive.org/web/20230712035524/https:/tetech.com/>, published on Jul. 12, 2023, 2 pages.

* cited by examiner

900

906

1014

1022

Heating COP

+ Thermoelectric assembly

1024

Cold fluid temperature

1100

OBTAINING HIGH COEFFICIENT OF PERFORMANCE IN HEATING OR COOLING BY USING THERMOELECTRIC MODULE(S)

TECHNICAL FIELD

This document relates to obtaining a high coefficient of performance in heating and/or cooling by using one or more thermoelectric modules.

BACKGROUND

Thermal systems are used for controlling temperature in vehicles and other contexts such as energy storage systems. Vehicles can use a thermal system to control the temperature of a passenger compartment, battery, and/or drivetrain. The most commonly used technologies for thermal management (i.e., heating and cooling) in electric vehicles and energy storage systems are passive or low energy methods, electric heating, and heat pumps.

Examples of passive or low energy methods include those that cool a battery pack by blowing air on it or by circulating a coolant through the battery pack where this coolant is itself cooled by ambient air through a heat exchanger. While some of these systems may have relatively low driving power requirements, their main shortcoming is that they are limited by the temperature difference between the component and the cooling medium. For example, if the ambient air is at 40° C., passive cooling cannot achieve a much lower temperature for the cooled device, a similar drawback applying to heating scenarios.

The basic idea in electric heating is passing current through a resistor and making use of the resistive heating (sometimes referred to by the formula $I^2R$, or referred to as joule heating or ohmic heating). Electric heating is commonly used in electric vehicles, energy storage systems, and residential heating, ventilation and air conditioning (HVAC) systems. Electric heating may have the benefit of being responsive and easily controlled. One significant disadvantage is the low coefficient of performance (COP) of electric heating. At best, electric heating can achieve a COP of one, which means that for every unit of electric energy spent a unit of heat can be generated. This may not be an ideal or even advantageous utilization of electricity because electricity may have greater value (or availability) than thermal energy. For example, one thousand watt (kilowatt, or kW) of electricity can be converted to 1 kW of heat but the converse is not true.

Heat pumps (or vapor compression systems in general) may be composed of five main parts: a refrigerant (the working fluid which transfers heat mainly through phase change), a condenser (which delivers heat through condensation), an evaporator (absorbs heat through evaporation), a compressor (which increases the pressure of the refrigerant and drives the refrigerant through the cycle), and an expansion device (which reduces the pressure of the refrigerant and converts it to a two phase liquid-vapor mixture). Heat pumps may provide higher COPs than electric heaters (e.g., about 2-2.5) at moderate operating conditions. However, at low operating temperatures, where the heat pump may be needed the most, the COP of the heat pump approaches unity (similar to electric heaters). Also, at low ambient temperatures, heat pumps may struggle to deliver required heating capacity (in kW). This is mainly because of the low density of the refrigerant at the compressor inlet which limits the mass flow rate of the circulated refrigerant in the heat pump cycle.

SUMMARY

In an aspect, a device comprises: a first fluid channel for a first fluid, the first fluid channel including first barriers; a second fluid channel for a second fluid, the second fluid channel including second barriers; and a thermoelectric module between the first and second fluid channels, the thermoelectric module thermally coupled to each of the first and second fluid channels.

Implementations can include any or all of the following features. The first fluid channel defines a first flow direction, and wherein the second fluid channel defines a second flow direction. The first barriers extend substantially perpendicular to the first flow direction, and wherein the second barriers extend substantially perpendicular to the second flow direction. The first fluid channel is oriented so that the first flow direction is substantially aligned with the second flow direction. The first fluid channel is oriented so that the first flow direction is opposite to the second flow direction. The first fluid channel is oriented so that the first flow direction is substantially perpendicular to the second flow direction. The device comprises multiple thermoelectric modules each having a corresponding first fluid channel and a corresponding second fluid channel, the multiple thermoelectric modules arranged in a planar m*n grid that includes m=1, 2, 3, . . . of the multiple thermoelectric modules situated along a first direction, and n=1, 2, 3, . . . of the multiple thermoelectric modules situated along a second direction perpendicular to the first direction. On a first side of the multiple thermoelectric modules each of the corresponding first fluid channels are oriented in the first flow direction, and on a second side of the multiple thermoelectric modules opposite to the first side each of the corresponding second fluid channels are oriented in the second flow direction. The corresponding first fluid channels are oriented so that the first flow direction is substantially aligned with the second flow direction. The first flow direction is opposite to the second flow direction. The corresponding first fluid channels are oriented so that the first flow direction is substantially perpendicular to the second flow direction. The device comprises multiple planar m*n grids that are sandwiched with each other in a three-dimensional m*n*p grid, the three-dimensional m*n*p grid including p=1, 2, 3, . . . of the planar m*n grids. In a first three-dimensional m*n*p grid the corresponding first fluid channels are oriented so that the first flow direction is substantially parallel to the first fluid channels of at least a second three-dimensional m*n*p grid. The first flow direction of the first three-dimensional m*n*p grid is opposite to the first flow direction of the second three-dimensional m*n*p grid. The corresponding first fluid channels of a first three-dimensional m*n*p grid are oriented so that the first flow direction is substantially perpendicular to the corresponding first fluid channels of at least a second three-dimensional m*n*p grid. At least the first barriers comprise offset strip fins. Each of the offset strip fins comprises ridges each defining a corresponding passage that is substantially perpendicular to the first flow direction, the ridges arranged in multiple rows, wherein first ridges in a first row abut, and are offset along the first flow direction from, second ridges in a second row. At least the first barriers are arranged in rows that are substantially perpendicular to the first flow direction, each row including multiple barriers that are spaced from each other to form openings. A first barrier in a first row is offset, along a direction of the first row, from a second barrier in a second row, the second row adjacent to the first row. A third barrier in a third row is aligned with the first barrier, along the direction of the first row, the third row adjacent to the second row on a side opposite to the first row. At least one of the first or second fluids comprises at least one selected from the group consisting of liquid, water, glycol, refrigerant, gas, air, oxygen, nitrogen, carbon dioxide, and oil. The first barriers have substantially a common shape with the second barriers. The thermoelectric module is a first thermoelectric module, the device further comprising a second thermoelectric module between the first and second fluid channels, the second thermoelectric module abutting the first thermoelectric module, wherein the first and second thermoelectric modules are both thermally coupled to each of the first and second fluid channels.

BRIEF DESCRIPTION OF DRAWINGS

Like reference symbols in the various drawings indicate like elements.

DETAILED DESCRIPTION

Figure 1:
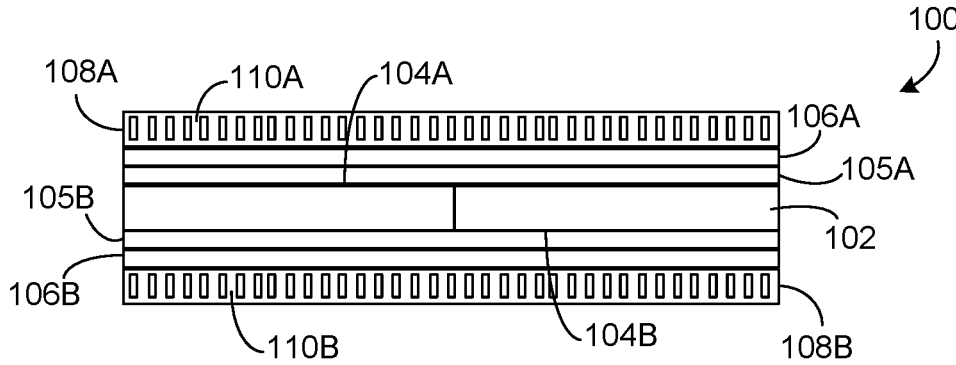
FIG. 1 shows an example of a device that performs heating and/or cooling with a high coefficient of performance.

This document describes examples of systems and techniques that can obtain a high COP in heating and/or cooling by using one or more thermoelectric modules. The present subject matter can enhance the use of the available thermoelectric modules in the market to achieve heating COP higher than the commonly used technology in the market (which is a combination of heat pumps and electric heaters). Particularly, the present disclosure describes examples of harnessing the benefits of thermoelectric modules while overcoming their limitations. A relatively high COP can be obtained by: 1) using a heat exchanger having a high heat transfer rate for a thermoelectric assembly, 2) modeling and operating at maximum COP points of the thermoelectric modules, and 3) enhancing the system-level utilization of the thermoelectric assembly. This can be done by designing an efficient system to supply and extract the heat to/from the thermoelectric module, operating the thermoelectric module(s) at or near their optimum operating range (i.e., the highest COP range), and implementing the thermoelectric module(s) in a system to enhance their combined COP. The present subject matter can achieve the highest COP when used to provide simultaneous heating and cooling. For example, this can involve cooling the coolant that extracts heat from the powertrain or battery while at the same time heating the coolant that provides heat to the cabin. An advantage that can be obtained using the present subject matter is to reduce the energy consumption needed for heating and/or cooling. Another advantage can be the ability to provide sufficient heating or cooling during extreme weather conditions (situations where the ambient temperature would otherwise be considered too cold or too hot for certain thermal systems).

Implementations of the present subject matter can provide any or all of the following advantages. A device for heating and/or cooling can provide a COP greater than one at almost all operating conditions (e.g., this is superior to an electric heater). A device can provide a high heating COP at cold soak scenarios (when the heat source and sink temperatures are close to each other and to the low ambient temperature). A device can have high capacity at low ambient conditions (e.g., when heat pump capacity suffers due to low refrigerant density). A device can be provided that offers the possibility of operation of a thermoelectric module at its highest COP (e.g., a heating COP, cooling COP, or a combined heating/cooling COP). A device can be provided that offers fast response, and close control of temperature (e.g., superior to vapor compression systems). A device can be provided that offers the capability of simultaneously heating and cooling at a higher combined COP (e.g., in contrast to electric heaters). A device can be provided with a lower or compatible price of manufacture than electric heaters. A device can be provided that is more compact and weighs less than other types of heaters of similar capacity. A device can be provided whose performance is stable with temperature level changes for the same temperature difference between the cooling and heating sides of the device (i.e., more sensitive to the temperature difference than the actual magnitude of the temperatures).

Examples described herein refer to a vehicle. As used herein, a vehicle is a machine that transports passengers or cargo, or both. A vehicle can have one or more motors using at least one type of fuel or other energy source (e.g., electricity). Examples of vehicles include, but are not limited to, cars, trucks, and buses. The number of wheels can differ between types of vehicles, and one or more (e.g., all) of the wheels can be used for propulsion of the vehicle, or the vehicle can be unpowered (e.g., when a trailer is attached to another vehicle). A vehicle can have one or more traction motors. For example, a traction motor can be an electric motor. As another example, a traction motor can be an internal combustion motor. The vehicle can include a passenger compartment accommodating one or more persons.

Examples described herein refer to a thermoelectric module. As used herein, a thermoelectric module transfers heat from one of its sides to another when electric power is applied to the thermoelectric module, and includes at least one N—P couple. An N—P couple, as used herein, includes at least one N-type semiconductor (i.e., doped with an electron donor element), and at least one P-type semiconductor (i.e., doped with an electron acceptor element).

Examples described herein refer to a heat pump. As used herein, a heat pump transfers heat from a cool space to a warm space by compressing and then decompressing a refrigerant.

Examples described herein refer to a coefficient of performance (COP). As used herein, a COP is defined as the ratio of the useful power (e.g., the heating, cooling or both) divided by the paid power (e.g., the electric power supply to operate the equipment). Thermoelectric technology enjoys the good of both worlds of electric heating and vapor compression systems. Being electric, thermoelectric technologies are quick to respond, can be controlled precisely to a certain temperature, and easy to use especially in an environment where electricity is available (e.g., electric vehicles and energy storage systems). Similar to vapor compression systems, thermoelectric modules are not limited by the ambient conditions, and have the potential to achieve COPs higher than one. One extra advantage that thermoelectric modules have, over electric heating and vapor compression systems, is the fact that they can quickly reverse their direction of heat flow, by just a simple reverse of polarity of their power supply. The main limitation to high COPs in thermoelectric modules is their surface temperatures. The higher the temperature difference between the hot and cold surfaces of the thermoelectric module, the lower their COP becomes.

FIG. 1 shows an example of a device 100 that performs heating and/or cooling with a high coefficient of performance. The device 100 can be used with one or more other examples described elsewhere herein. The device 100 includes a thermoelectric module 102 that can have any form factor. In this example, the thermoelectric module 102 has a generally flat configuration and is viewed from the side, with a main surface 104A that is parallel to and opposite from a main surface 104B. The thermoelectric module 102 is electrically connected to a power source (not shown). When the thermoelectric module 102 is powered, one of the main surfaces 104A-104B is cooled and the other of the main surfaces 104A-104B is heated. Reversing the polarity of applied voltage will reverse the direction of heat flow. The device 100 can have substrates 105A-105B at the thermoelectric module 102. The substrates 105A-105B can cover at least the main surfaces 104A-104B, respectively (e.g., optionally the entire outside of the thermoelectric module 102). The substrates 105A-105B can provide packaging and electrical insulation of the thermoelectric module 102. For example, the substrates 105A-105B can include a ceramic material.

A thermal interface material can be provided that faces either or both of the main surfaces 104A-104B. The thermal interface material is any layer that enhances the thermal coupling between the respective main surface 104A or 104B and a surface of another object abutting the thermal interface material. The thermal interface material can include a thermal paste, a thermal adhesive, a thermally conductive pad, thermal tape, thermal grease, a phase-change material, a ceramic material, solder material or another metal, to name just a few examples. Here, a thermal interface material 106A is provided onto the substrate 105A at the main surface 104A, and a thermal interface material 106B is provided onto the substrate 105B at the main surface 104B. The thermal interface materials 106A-106B can be the same type of material as each other or different types.

The device 100 has fluid channels on both sides of the thermoelectric module 102. Here, a fluid channel 108A is provided facing the main surface 104A, and a fluid channel 108B is provided facing the main surface 104B. The fluid channel 108A defines a first flow direction for a first fluid, such as in a direction into or out of the page in the present illustration. The fluid channel 108A has barriers 110A that extend substantially perpendicular to the first flow direction of the first fluid (e.g., substantially vertical in the illustration). The fluid channel 108B defines a second flow direction for a second fluid, such as in a direction into or out of the page in the present illustration. The fluid channel 108B has barriers 110B that extend substantially perpendicular to the second flow direction of the second fluid (e.g., substantially vertical in the illustration).

The first and second fluids will be caused to flow in the fluid channels 108A and 108B, respectively. When the thermoelectric module 102 is powered, heat will be absorbed from one of the first and second fluids and rejected to the other of the first and second fluids. Any of multiple types of fluid can be used. In some implementations, a fluid selected from the group consisting of a liquid, water, glycol, a refrigerant, gas, air, oxygen, nitrogen, carbon dioxide, or oil, can be used. The first and second fluids can be the same type of fluid as each other or different types of fluid.

Here, the first fluid channel is oriented so that the first flow direction is substantially parallel to the second flow direction. Namely, both of the first and second flow directions are oriented in a direction into or out of the page in the illustration. In some implementations, the first flow direction is opposite to the second flow direction. For example, the first flow direction can be oriented into the page in the illustration, and the second flow direction can be oriented out of the page in the illustration. In some implementations, the first fluid channel is oriented so that the first flow direction is substantially perpendicular to the second flow direction. This can be accomplished by instead orienting one of the fluid channels 108A and 108B so as to be perpendicular to the other of the fluid channels 108A and 108B. For example, one of the fluid channels 108A and 108B can then instead have a flow direction into or out of the present illustration, while the other of the fluid channels 108A and 108B has a flow direction between left and right in the illustration.

Figure 2:
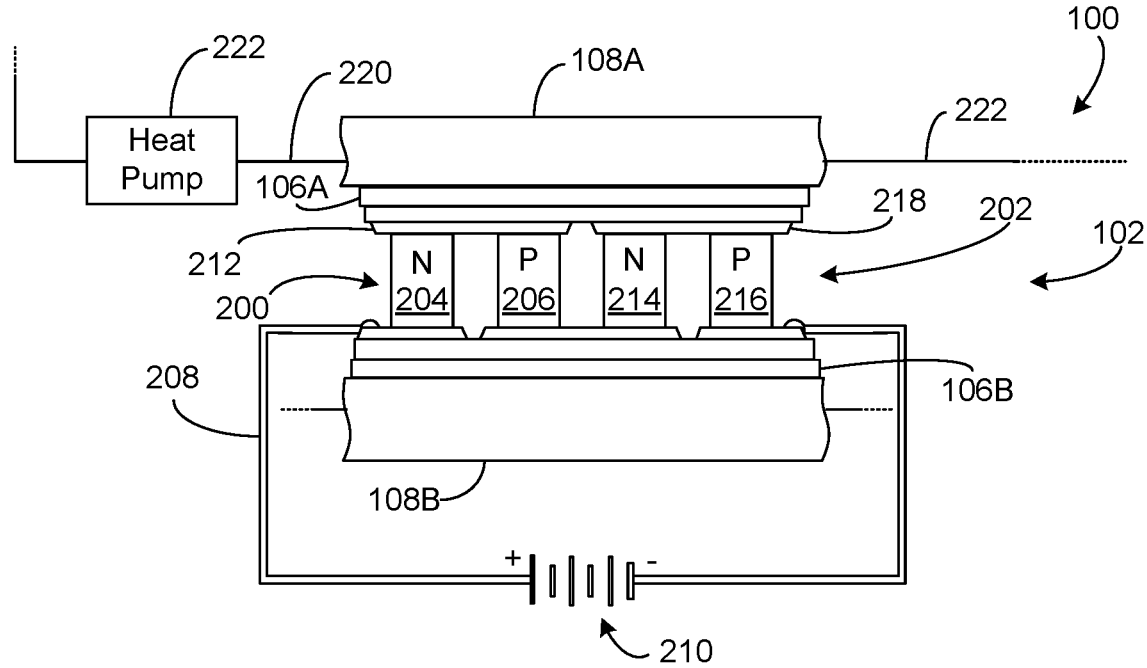
FIG. 2 shows an example of the device of FIG. 1.

FIG. 2 shows an example of the device 100 of FIG. 1. Elements that are substantially similar to those mentioned with reference to FIG. 1 are not described in detail. The fluid channels 108A-108B are here shown truncated at their respective ends to illustrate that they can have various shapes and lengths. The thermoelectric module 102 includes any number of N—P couples. Here, an N—P couple 200 and an N—P couple 202 are shown. The N—P couple 200 includes an N-type semiconductor 204 and a P-type semiconductor 206. The N-type semiconductor 204 is connected to a direct current (DC) circuit 208. The DC circuit 208 also includes a DC power source 210. The N-type semiconductor 204 and the P-type semiconductor 206 are connected to each other by an electrical interconnect 212. The electrical interconnect 212 is thermally coupled to the fluid channel 108A (e.g., with at least the thermal interface material 106A in between). The N—P couple 202 includes an N-type semiconductor 214 and a P-type semiconductor 216 that are both connected to the DC circuit 208. The P-type semiconductor 216 is connected to the DC circuit 208. The N-type semiconductor 214 and the P-type semiconductor 216 are connected to each other by an electrical interconnect 218. The electrical interconnect 218 is thermally coupled to the fluid channel 108A (e.g., with the thermal interface material 106A in between). On the other side of the N—P couples 200 and 202 from the electrical interconnects 212 and 218 the thermoelectric module 102 is thermally coupled to the fluid channel 108B (e.g., with at least the thermal interface material 106B in between).

The fluid channel 108A is part of a thermal system 220 that is here schematically illustrated. The thermal system 220 is configured for circulating the first fluid through a circuit, including that the first fluid flows through the fluid channel 108A. The thermal system 220 can also include other components such as a pump, a radiator, an evaporator, and/or a condenser (not shown). For example, the thermal system 220 can serve to cool a passenger cabin of a vehicle, a powertrain of a vehicle, or a battery pack (e.g., in a vehicle or in a stationary energy storage system). The thermal system 220 can include a heat pump 222 that can also serve to heat and/or cool one or more components (e.g., any of the components just mentioned). The heat pump 222 interacts with the fluid of the fluid channel 108A. In some implementations, the device 100 can enhance or complement the operation of the heat pump 222. For example, the device 100 can be placed between the ambient temperature and the heat pump 222. This can allow the thermal system 220 to operate with high capacity at low ambient conditions, when the capacity of the heat pump 222 may suffer due to low refrigerant density. That is, unlike the heat pump 222, the performance of the device 100 does not depend much on the magnitude of the temperature of the fluid (e.g., the material of the thermoelectric module 102 has an optimum operating temperature range), but mainly depends on the difference in temperature between two fluids (sometimes referred to as the delta temperature).

Figure 3:
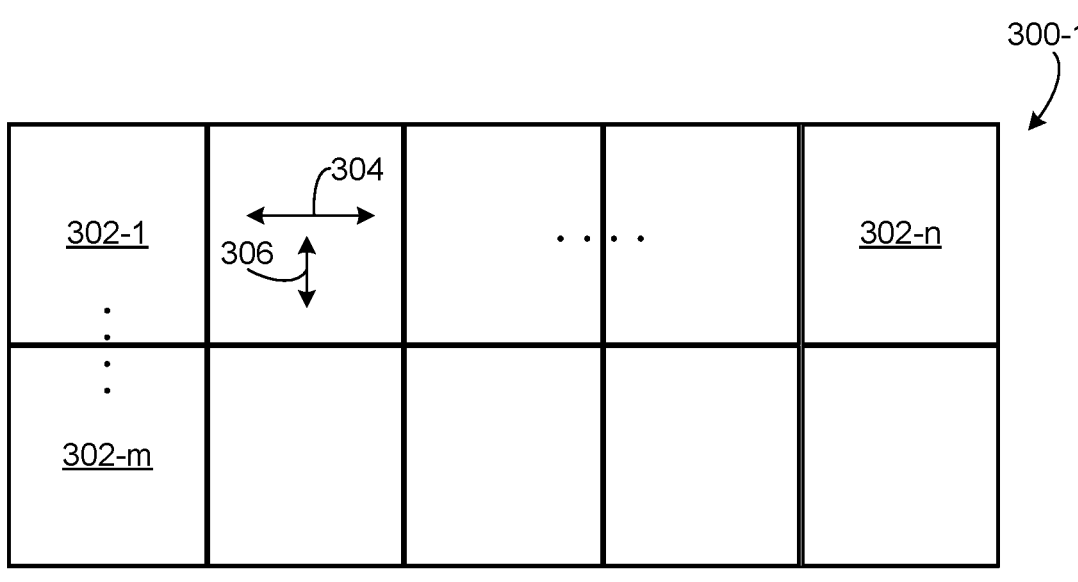
FIG. 3 shows an example of a device that includes a planar m*n grid of thermoelectric modules.

FIG. 3 shows an example of a device 300-1 that includes a planar m*n grid of thermoelectric modules. The device 300-1 can be used with one or more other examples described elsewhere herein. The device 300-1 can obtain a high COP in heating and/or cooling.

The device 300-1 is here oriented so that one of the main surfaces of the thermoelectric modules (e.g., one of the main surfaces 104A-104B in FIG. 1) faces up. The device 300-1 includes m number of rows of thermoelectric modules, where m=1, 2, 3, . . . , of which rows those beginning with a thermoelectric module 302-1 or a thermoelectric module 302-m, respectively, are shown. The device 300-1 includes n number of columns of thermoelectric modules, where n=1, 2, 3, . . . , of which those beginning with the thermoelectric module 302-1 and a thermoelectric module 302-n, respectively, are shown. As such, the device 300-1 includes m*n number of thermoelectric modules (in this example, 2*5=10 thermoelectric modules). Each of the thermoelectric modules has a corresponding first fluid channel and a corresponding second fluid channel.

The device 300-1 in FIG. 3 can provide any of multiple directions of fluid flow. The fluid channels on those of the main surfaces that face the viewer in this illustration can be oriented along a direction 304 (e.g., along one of the m number of rows) or can be oriented along a direction 306 (e.g., along one of the n number of columns). The fluid channels on those other main surfaces that face away from the viewer in this illustration can be oriented in the same direction as the visible fluid channels, or in a different direction. In some implementations, the visible fluid channels are oriented along the direction 304, and the non-visible fluid channels are aligned with the visible fluid channels (i.e., also oriented along the direction 304). For example, the fluid flow in the non-visible fluid channels can then be parallel to (e.g., oriented in the same direction as) the fluid flow in the visible fluid channels. As another example, the fluid flow in the non-visible fluid channels can be a counterflow to (e.g., oriented in the opposite direction of) the fluid flow in the visible fluid channels. In some implementations, the visible fluid channels are oriented along the direction 304, and the non-visible fluid channels are substantially perpendicular to the fluid flow in the visible fluid channels (e.g., oriented in the direction 306).

Figure 4A:
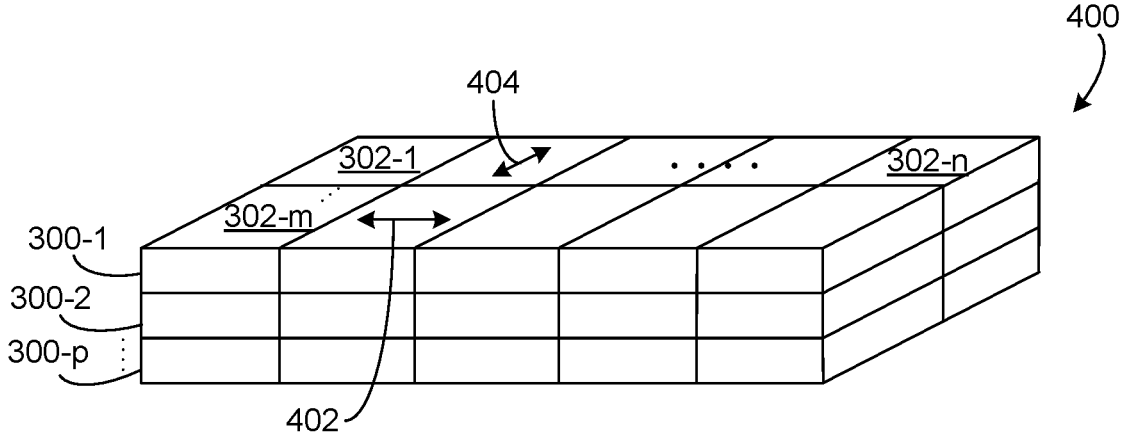
FIG. 4A shows an example of a device that includes a three-dimensional m*n*p grid of thermoelectric modules.

FIG. 4A shows an example of a device 400 that includes a three-dimensional m*n*p grid of thermoelectric modules. The device 400 can be used with one or more other examples described elsewhere herein. The device 400 can obtain a high COP in heating and/or cooling.

The device 400 is here shown in perspective view. The device 400 includes p number of the device 300-1 sandwiched with each other, with p=1, 2, 3, . . . , of which the device 300-1, a device 300-2, and a device 300-p are shown. Elements that are substantially similar to those mentioned with reference to FIG. 3 are not described in detail.

The device 400 can provide any of multiple directions of fluid flow. Some fluid channels can be oriented along a direction 402 (e.g., along one of the m number of rows) or can be oriented along a direction 404 (e.g., along one of the n number of columns). As such, for any of the devices 300-1, 300-2, and 300-p the respective fluid flows on the opposite sides of the thermoelectric module can be aligned with each other (e.g., in a parallel or counter-flow fashion), or can be substantially perpendicular to each other (i.e., in a cross-flow fashion). Moreover, any of the devices 300-1, 300-2, and 300-p can have a configuration of fluid flows different from that of at least another one of the devices 300-1, 300-2, and 300-p.

Figure 4B:
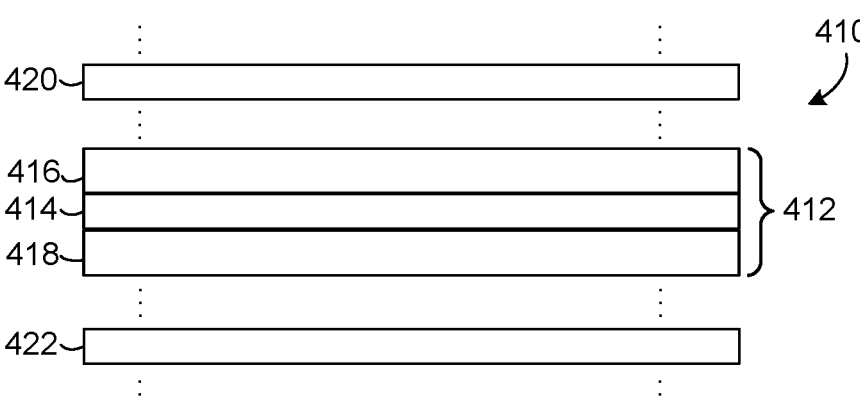
FIG. 4B shows an example of a device that includes a fluid channel between one or more pairs of thermoelectric devices.

FIG. 4B shows an example of a device 410 that includes a fluid channel between each of at least one pair of thermoelectric devices. The device 410 can be used with one or more other examples described elsewhere herein. The device 410 can obtain a high COP in heating and/or cooling.

The device 410 is here schematically shown in a side view. The device 410 includes q number of instances of a structure 412, with q=1, 2, 3, . . . . The structure 412 includes a fluid channel 414 that is sandwiched between a thermoelectric module 416 and a thermoelectric module 418. The device 410 can include one or more components in addition to the structure 412. In some implementations, a fluid channel 420 is positioned at the thermoelectric module 416 on an opposite side from the fluid channel 414. For example, the fluid channel 420 can be positioned as an outermost layer of the device 410, or the fluid channel 420 can be positioned between the structure 412 and another layer (e.g., another instance of the structure 412). In some implementations, a fluid channel 422 is positioned at the thermoelectric module 418 on an opposite side from the fluid channel 414. For example, the fluid channel 422 can be positioned as an outermost layer of the device 410, or the fluid channel 422 can be positioned between the structure 412 and another layer (e.g., another instance of the structure 412).

Figure 4C:
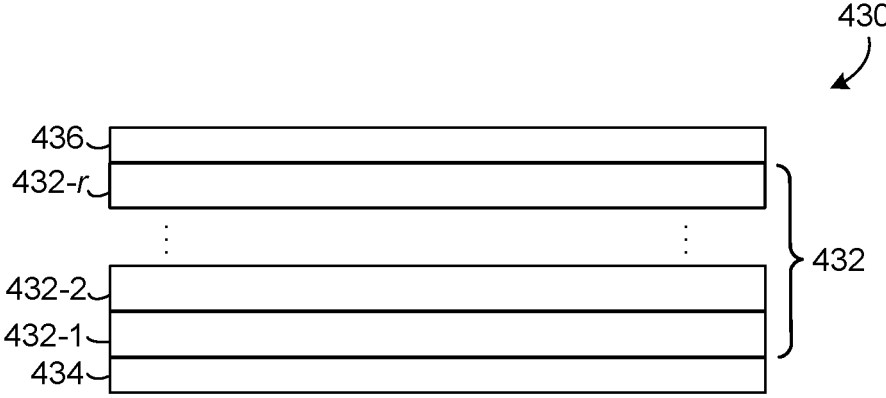
FIG. 4C shows an example of a device in which multiple thermoelectric devices are sandwiched between fluid channels.

FIG. 4C shows an example of a device 430 in which multiple thermoelectric devices are sandwiched between fluid channels. The device 430 can be used with one or more other examples described elsewhere herein. The device 430 can obtain a high COP in heating and/or cooling.

The device 430 is here schematically shown in a side view. The device 430 can include two or more thermoelectric modules 432 abutting each other. Here, thermoelectric modules 432-1, 432-2, . . . , 432-r, with r=2, 3, 4, . . . are shown. The device 430 includes fluid channels 434 and 436. The thermoelectric modules 432 can be stacked with each other. The thermoelectric modules 432 can be sandwiched between the fluid channels 434 and 436.

As such, in the device 430 the thermoelectric modules 432 can be stacked on-top of each other with the fluid channels 434-436 only at the topmost and bottommost module surfaces of the stage. This has the potential of reducing the temperature difference across a module, which enables high module COP at even large temperature difference applications. The device 430 can include one or more additional components (not shown).

Figure 5:
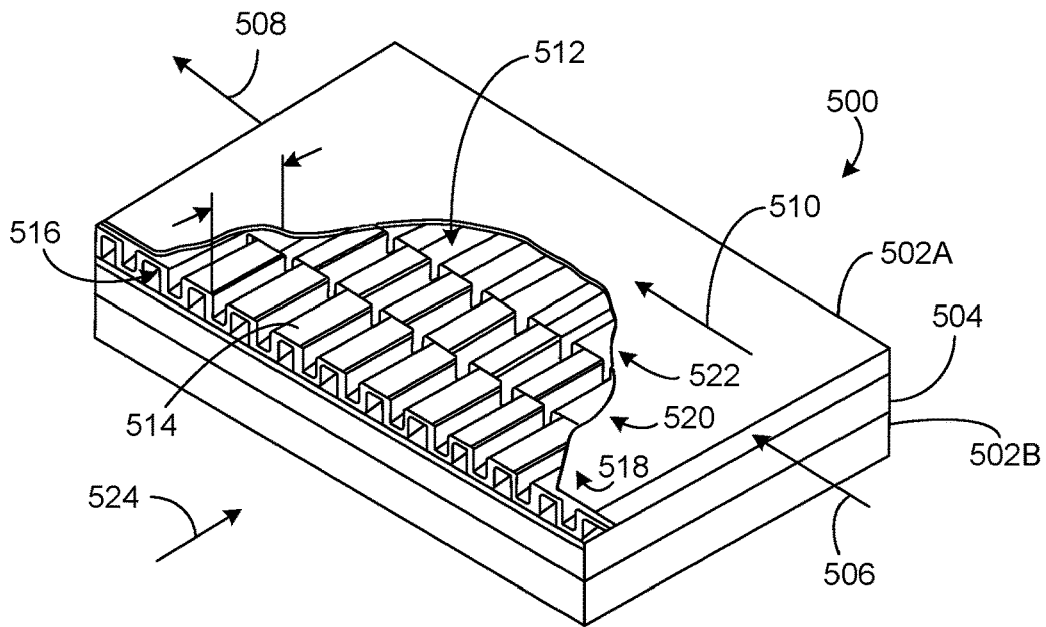
FIG. 5 shows an example of a device that includes barriers.

FIG. 5 shows an example of a device 500 that includes barriers. The device 500 can be used with one or more other examples described elsewhere herein. The device 500 includes a fluid channel 502A, a fluid channel 502B, and a thermoelectric device 504 that is sandwiched between the fluid channels 502A-502B. A thermal interface material (e.g., the thermal interface material 106A or 106B in FIG. 1) can be placed between the thermoelectric device 504 and each of the fluid channels 502A and 502B. The device 500 can obtain a high COP in heating and/or cooling.

The fluid channel 502A is shown with a partial cutaway for illustrative purposes. The fluid channel 502A has an inlet 506 and an outlet 508 for a fluid passing through the fluid channel 502A. As such, while the fluid flow inside the fluid channel 502A may not be linear, the general direction of flow is characterized by a flow direction 510. A flow direction of the fluid channel 502B can be aligned with, or substantially perpendicular to, the flow direction 510, in analogy with examples described above.

Each of the fluid channels 502A-502B includes corresponding barriers that extend substantially perpendicular to the respective flow direction of the fluid channel. The fluid channel 502A has barriers 512 that are visible in the partial cutaway. In some implementations, the barriers 512 include offset strip fins. Each of the offset strip fins can include ridges 514. Each of the ridges 514 can define a corresponding passage 516 that is substantially perpendicular to the flow direction 510. Namely, the ridges 514 can be arranged in at least rows 518, 520, and 522. Each of the ridges 514 in the row 518 can abut and partially overlap at least one corresponding ridge in the row 520. Similarly, each ridge in the row 520 can abut and partially overlap at least one corresponding ridge in the row 522. To provide the partial overlap, the ridge 514 in the row 518 can be offset, along the flow direction 510, from the corresponding ridge in the row 520. For example, the passage 516 of the ridge 514 in the row 518 is not aligned with the corresponding passage 516 of the ridge in the row 520, but may overlap both the corresponding passage and the ridge of that corresponding passage. In earlier uses of offset strip fins, fluid flow has typically occurred in a flow direction 524. Here, by contrast, the fluid flow in the fluid channel 502A is along the flow direction 510, which is substantially perpendicular to the flow direction 524. Using the flow direction 510 where the barriers 512 are perpendicular to the direction of the flow can provide a substantially higher heat transfer coefficient for the device 500. For example, the higher heat transfer coefficient can correspond to the device 500 having a relatively higher heat transfer rate at the same inlet electric power (i.e., higher COP). The barriers in the fluid channel 502B can have substantially a common shape as, or a different shape from, the shape(s) of the barriers 512 of the fluid channel 502A.

Figure 6:
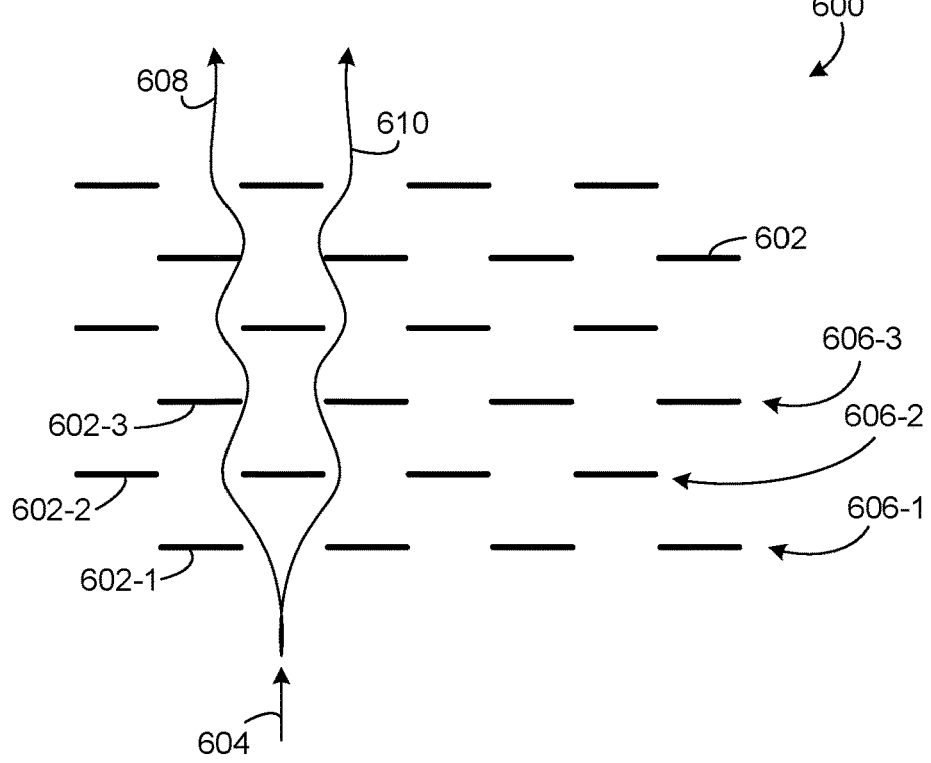
FIG. 6 shows an example of a fluid channel that includes barriers.

FIG. 6 shows an example of a fluid channel 600 that includes barriers 602. The fluid channel 600 can be used with one or more other examples described elsewhere herein. For example, the fluid channel 600 can be provided on both sides of a thermoelectric module to create a device that can obtain a high COP in heating and/or cooling.

The fluid channel 600 is schematically shown in a top view. The barriers 602 are arranged in rows that are substantially perpendicular to a flow direction 604. Each row includes multiple barriers that are spaced from each other to form openings. Here, a barrier 602-1 in a row 606-1 is offset, along a direction of the row 606-1, from a barrier 602-2 in a row 606-2. The row 606-2 is adjacent the row 606-1. A barrier 602-3 in a row 606-3 is offset, along the direction of the row 606-1, from the barrier 602-2 in the row 606-2. The row 606-3 is adjacent to the row 606-2 on a side opposite from the row 606-1. As such, the fluid that enters the fluid channel 600 in the flow direction 604 can take one or more paths through the barriers 602. The fluid can take a path 608 and/or a path 610, to name just a few examples. Having the barriers 602 in a perpendicular-to-the-flow position can provide a substantially higher heat transfer coefficient for a device that includes the fluid channel 600. For example, the higher heat transfer coefficient indicates that the device has a relatively higher heat transfer rate at the same inlet electric power (i.e., higher COP). The fluid channel on the opposite side of the thermoelectric module can similarly have barriers perpendicular to the fluid flow direction. The barriers in such a fluid channel can have substantially a common shape as, or a different shape from, the shape of the barriers 602 of the fluid channel 600.

With reference again briefly to FIGS. 1-6, the examples described above illustrate that a device can include: a first fluid channel (e.g., the fluid channel 108A, 108B, 502A, 502B, and/or 600) defining a first flow direction (e.g., the flow direction 304, 306, 510, and/or 604) for a first fluid, the first fluid channel including first barriers (e.g., the barriers 110A, 110B, 512, and/or 602) that extend substantially perpendicular to the first flow direction; a second fluid channel (e.g., the fluid channel 108A, 108B, 502A, 502B, and/or 600) defining a second flow direction (e.g., the flow direction 304, 306, 510, and/or 604) for a second fluid, the second fluid channel including second barriers (e.g., the barriers 110A, 110B, 512, and/or 602) that extend substantially perpendicular to the second flow direction; and a thermoelectric module (e.g., the thermoelectric module 102, 302-1, 302-m, and/or 302-n) that is sandwiched between the first and second fluid channels, the thermoelectric module thermally coupled to each of the first and second fluids.

Figure 7A:
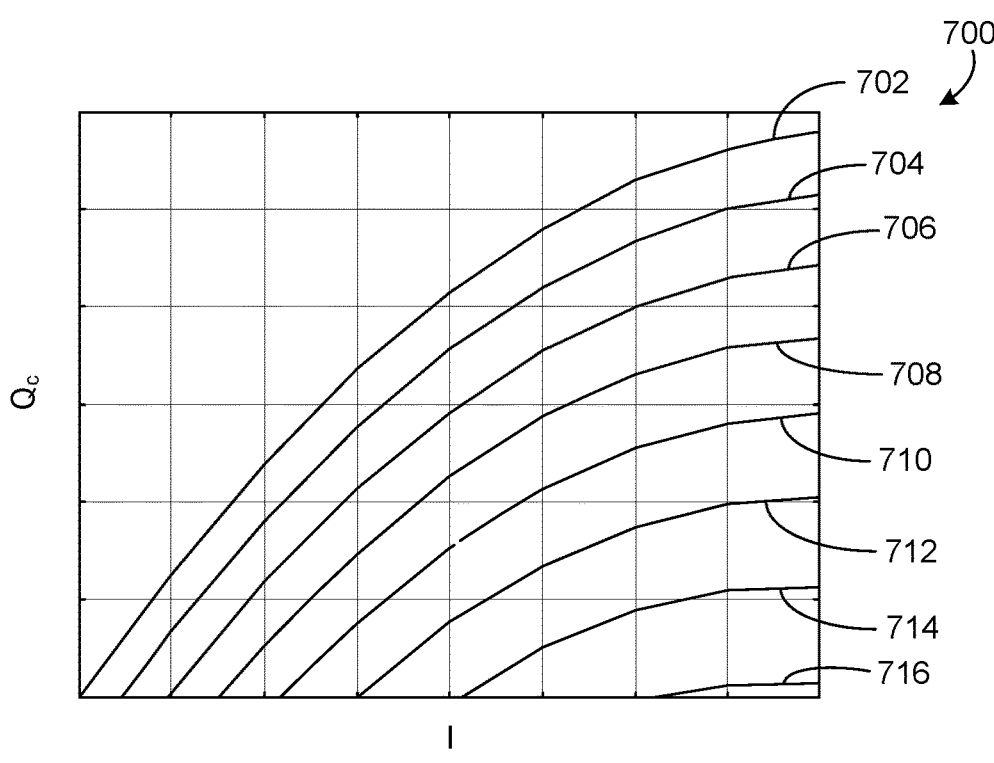
FIGS. 7A-7C show examples of absorbed heat rate, rejected heat rate, and input electric power, for a device.
Figure 7B:
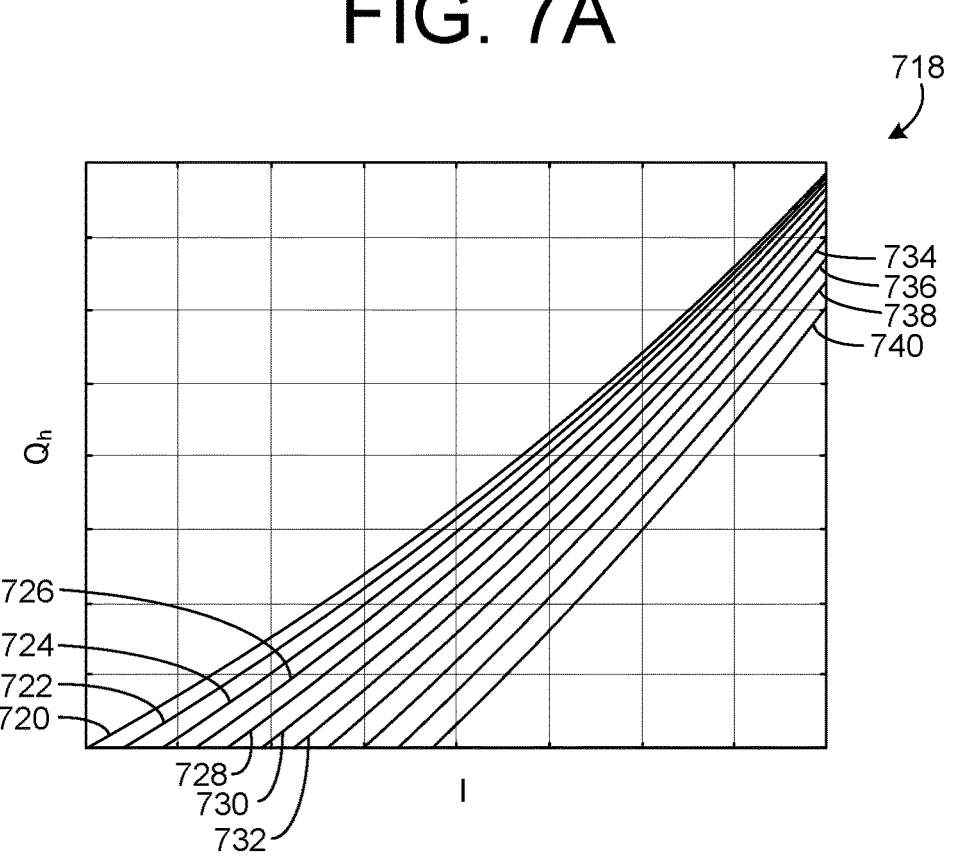
Figure 7C:
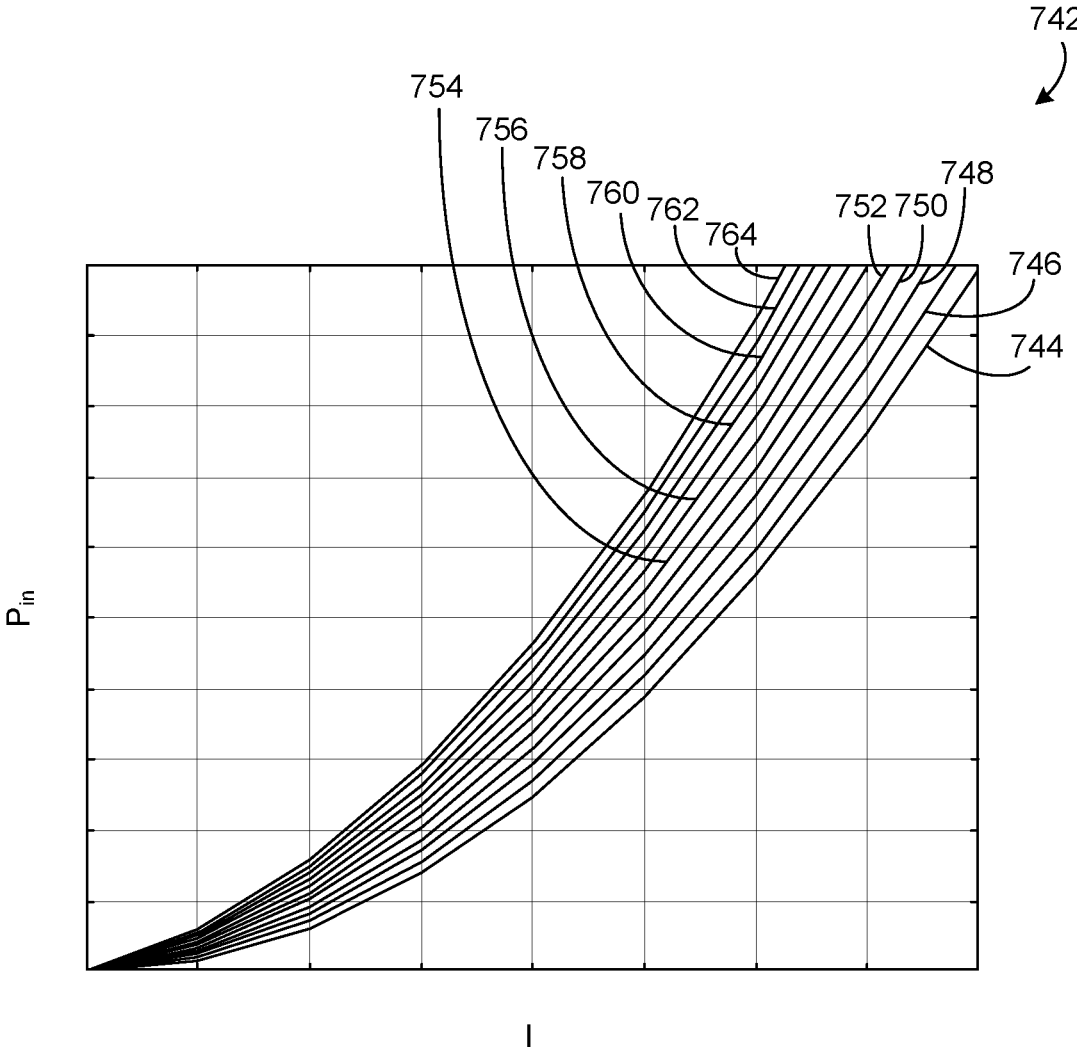

FIGS. 7A-7C show examples of absorbed heat rate, rejected heat rate, and input electric power, for a device. These characteristics can be applicable to one or more other examples described elsewhere herein. In FIG. 7A, the absorbed heat rate ($Q_c$) is indicated against a vertical axis of a chart 700 where current (I) is indicated against a horizontal axis. Graphs 702-716 are shown, each corresponding to a respective temperature difference between the hot and cold surfaces of the thermoelectric module. The graph 702 represents a temperature difference of 0.001 units of temperature (i.e., very close to zero temperature difference), the graph 704 represents a temperature difference of 10 units, the graph 706 represents a temperature difference of 20 units, the graph 708 represents a temperature difference of 30 units, the graph 710 represents a temperature difference of 40 units, the graph 712 represents a temperature difference of 50 units, the graph 714 represents a temperature difference of 60 units, and the graph 716 represents a temperature difference of 70 units.

The absorbed heat rate at the cold surface initially increases with the input current due to the thermoelectric effect, but then plateaus (i.e., the rate of increase declines) because of the ohmic heating which opposes the thermoelectric effect. That is, the ohmic heating tries to push heat in the opposite direction to the heat transferred by the thermoelectric effect. $Q_c$ decreases with the increase of the temperature difference between the hot and cold surfaces, because of a second mechanism that fights against the thermoelectric effect, namely conduction heat transfer through the module.

In FIG. 7B, the rejected heat rate ($Q_h$) is indicated against a vertical axis of a chart 718 where current is indicated against a horizontal axis. Graphs 720-740 are shown, each corresponding to a respective temperature difference between the hot and cold surfaces of the thermoelectric module. The graph 720 represents a temperature difference of 0.001 units of temperature (i.e., very close to 0 units temperature difference), the graph 722 represents a temperature difference of 10 units, the graph 724 represents a temperature difference of 20 units, the graph 726 represents a temperature difference of 30 units, the graph 728 represents a temperature difference of 40 units, the graph 730 represents a temperature difference of 50 units, the graph 732 represents a temperature difference of 60 units, the graph 734 represents a temperature difference of 70 units, the graph 736 represents a temperature difference of 80 units, the graph 738 represents a temperature difference of 90 units, and the graph 740 represents a temperature difference of 100 units.

The rejected heat rate at the hot surface continuously increases with the current, due to both the thermoelectric heating as well as the ohmic heating increase with the current. $Q_h$ decreases with the temperature difference, because of the conducted heat through the module in the reverse direction.

In FIG. 7C, the input electric power ($P_{in}$) is indicated against a vertical axis of a chart 742 where current is indicated against a horizontal axis. Graphs 744-764 are shown, each corresponding to a respective temperature difference between the hot and cold surfaces of the thermoelectric module. The graph 744 represents a temperature difference of 0.001 units of temperature (i.e., very close to zero units temperature difference), the graph 746 represents a temperature difference of 10 units, the graph 748 represents a temperature difference of 20 units, the graph 750 represents a temperature difference of 30 units, the graph 752 represents a temperature difference of 40 units, the graph 754 represents a temperature difference of 50 units, the graph 756 represents a temperature difference of 60 units, the graph 758 represents a temperature difference of 70 units, the graph 760 represents a temperature difference of 80 units, the graph 762 represents a temperature difference of 90 units, and the graph 764 represents a temperature difference of 100 units.

The input electric power to the module increases with the current because power is the product of the voltage and current. The $P_{in}$ increases with the increase in the temperature difference because the latter increases the thermoelectric voltage (i.e., the Seebeck effect).

Figure 8A:
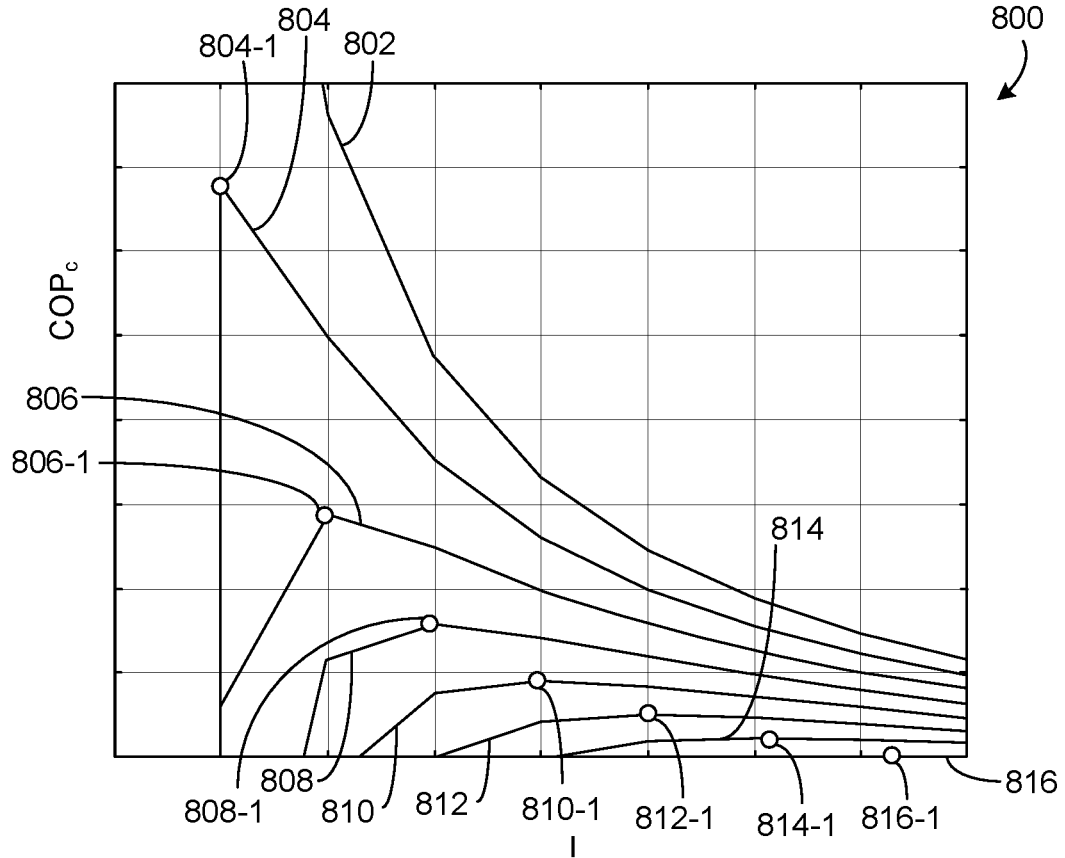
FIGS. 8A-8C show examples of COP for a device.
Figure 8B:
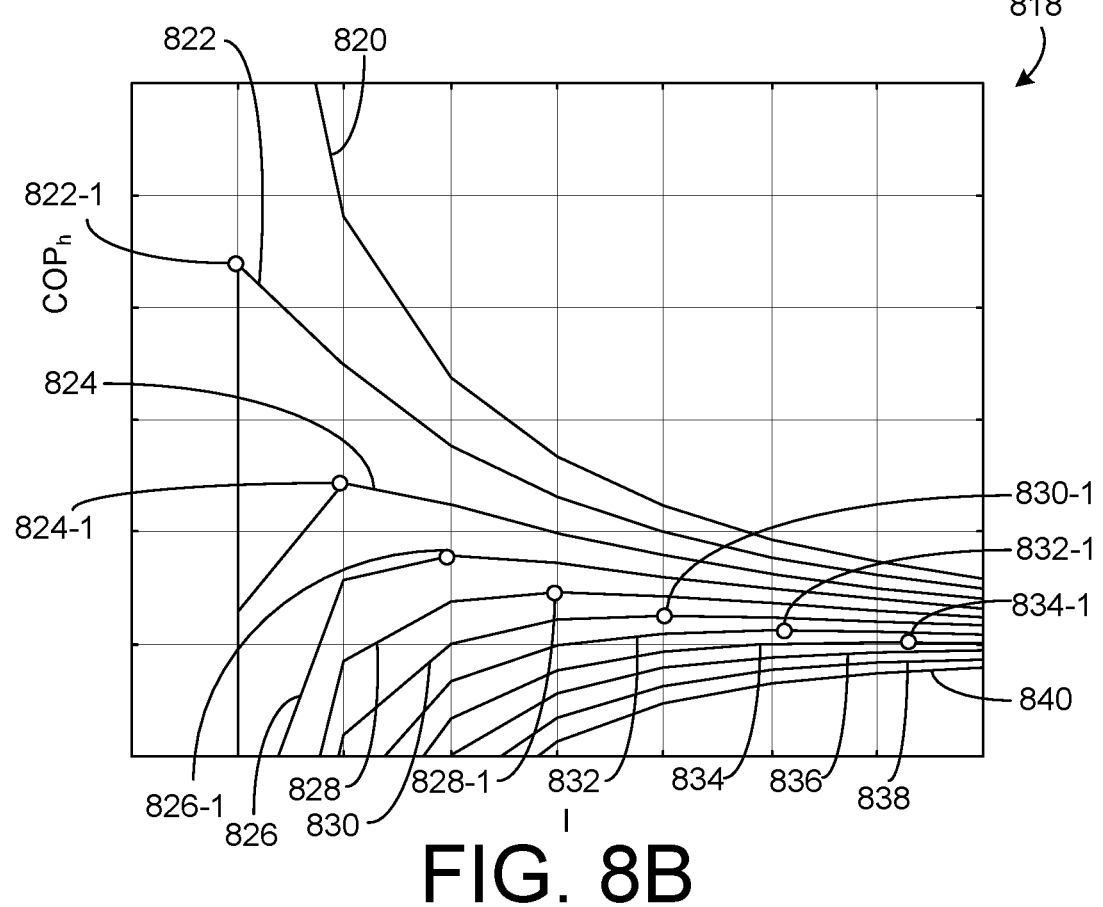
Figure 8C:
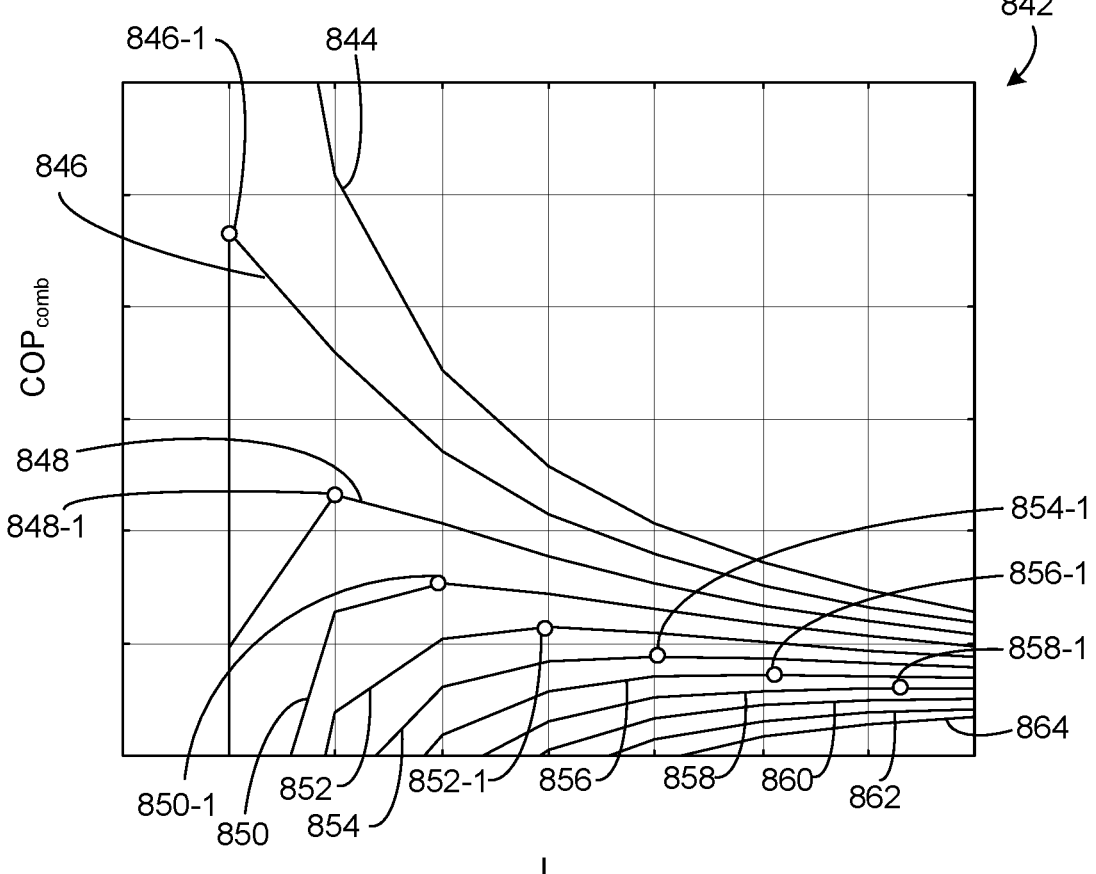

FIGS. 8A-8C show examples of COP for a device. These characteristics can be applicable to one or more other examples described elsewhere herein. In FIG. 8A, a cooling COP ($COP_c$) is indicated against a vertical axis of a chart 800 where current is indicated against a horizontal axis. The cooling COP is defined as the absorbed heat rate ($Q_c$) (e.g., a cooling heat transfer rate) divided by the input electric power to the module ($P_{in}$), or $Q_c/P_{in}$. Graphs 802-816 are shown, each corresponding to a respective temperature difference between the hot and cold surfaces of the thermoelectric module. The graph 802 represents a temperature difference of 0.001 units of temperature (i.e., very close to zero units temperature difference), the graph 804 represents a temperature difference of 10 units, the graph 806 represents a temperature difference of 20 units, the graph 808 represents a temperature difference of 30 units, the graph 810 represents a temperature difference of 40 units, the graph 812 represents a temperature difference of 50 units, the graph 814 represents a temperature difference of 60 units, and the graph 816 represents a temperature difference of 70 units.

In FIG. 8B, a heating COP ($COP_h$) is indicated against a vertical axis of a chart 818 where current is indicated against a horizontal axis. The heating COP is defined as the rejected heat rate ($Q_h$) (e.g., a heating heat transfer rate) divided by the input electric power to the module ($P_{in}$), or $Q_h/P_{in}$. Graphs 820-840 are shown, each corresponding to a respective temperature difference between the hot and cold surfaces of the thermoelectric module. The graph 820 represents a temperature difference of 0.001 units of temperature (i.e., very close to zero units temperature difference), the graph 822 represents a temperature difference of 10 units, the graph 824 represents a temperature difference of 20 units, the graph 826 represents a temperature difference of 30 units, the graph 828 represents a temperature difference of 40 units, the graph 830 represents a temperature difference of 50 units, the graph 832 represents a temperature difference of 60 units, the graph 834 represents a temperature difference of 70 units, the graph 836 represents a temperature difference of 80 units, the graph 838 represents a temperature difference of 90 units, and the graph 840 represents a temperature difference of 100 units.

In FIG. 8C, a combined COP ($COP_{comb}$) is indicated against a vertical axis of a chart 842 where current is indicated against a horizontal axis. The combined heat transfer rate is defined as the sum of the absorbed heat rate ($Q_c$) and the rejected heat rate ($Q_h$), divided by the input electric power to the module ($P_{in}$), or ($Q_c+Q_h$)/$P_{in}$. Graphs 844-864 are shown, each corresponding to a respective temperature difference between the hot and cold surfaces of the thermoelectric module. The graph 844 represents a temperature difference of 0.001 units of temperature (i.e., very close to zero units temperature difference), the graph 846 represents a temperature difference of 10 units, the graph 848 represents a temperature difference of 20 units, the graph 850 represents a temperature difference of 30 units, the graph 852 represents a temperature difference of 40 units, the graph 854 represents a temperature difference of 50 units, the graph 856 represents a temperature difference of 60 units, the graph 858 represents a temperature difference of 70 units, the graph 860 represents a temperature difference of 80 units, the graph 862 represents a temperature difference of 90 units, and the graph 864 represents a temperature difference of 100 units.

The charts 800, 818, and 842 indicate that COPs increase and then decrease with the current (due to the tradeoff between the heat transfer rates and the input power), and decrease with the temperature difference (mainly because of the reductions in the heat transfer rates). The present subject matter can harness the high COP of thermoelectric modules by using an efficient system that supplies the heat to, and extracts the heat from, a thermoelectric module; operating the thermoelectric module substantially at, or near, its highest COP current; and using the thermoelectric module for simultaneous heating and cooling to enhance system-level utilization.

Examples of relationships involving current expressions that can be used in the present subject matter will now be described. First, a cooling case will be addressed. The cooling case involves determining the cooling current to use (e.g., an optimum cooling current). For example, this can be the current corresponding to the maximum cooling COP at a certain temperature difference between the module surfaces. An optimum cooling current can be expressed as:

$$I\_opt\_c = max(I\_opt\_c\_pos, I\_opt\_c\_neg), \qquad (1)$$

where I_opt_c is the current corresponding to the maximum cooling COP per module, max corresponds to applying the maximum function, I_opt_c_pos is the positive root of a quadratic equation, and I_opt_c_neg is the negative root of the quadratic equation. That is, the optimum cooling current can be obtained by determining the two current expressions in (1) and taking the one that has the greater value. The arguments of (1) can be expressed as:

$$I\_opt\_c\_pos = (-b\_I\_opt\_c + sqrt((b\_I\_opt\_c^2) - (4*a\_I\_opt\_c))) \qquad (2)$$
$$/(2*a\_I\_opt\_c), \text{ and}$$

$$I\_opt\_c\_neg = \qquad (3)$$
$$(-b\_I\_opt\_c - sqrt((b\_I\_opt\_c^2) - (4*a\_I\_opt\_c*c\_I\_opt\_c)))$$
$$/(2*a\_I\_opt\_c),$$

respectively. The term a_I_opt_c used in (2) and (3) can be referred to as a quadratic term and can be expressed as:

$$a\_I\_opt\_c = \qquad (4)$$
$$0.5*S\_coeff\_mod*R\_mod*(t\_mod\_surf\_K\_h + t\_mod\_surf\_K\_c),$$

where S_coeff_mod is the Seebeck coefficient of the thermoelectric module, R_mod is the electric resistance of the thermoelectric module, t_mod_surf_K_h is the surface temperature of the hot side of the thermoelectric module, and t_mod_surf_K_c is the surface temperature of the cold side of the thermoelectric module.

The term b_I_opt_c used in (2) and (3) can be referred to as a linear term and can be expressed as:

$$b\_I\_opt\_c = \qquad (5)$$
$$-2*R\_mod*K\_mod*(t\_mod\_surf\_K\_h - t\_mod\_surf - K\_c)$$

where K_mod is the thermal conductance of the thermoelectric module, and other terms have the meanings mentioned above.

The term c_I_opt_c used in (2) and (3) can be referred to as a constant term and can be expressed as:

$$c\_I\_opt\_c = \qquad (6)$$
$$-S\_coeff\_mod*K\_mod*((t\_mod\_surf\_K\_h - t\_mod\_surf\_K\_c)^2),$$

where the terms have the meanings mentioned above.

The optimum cooling current as defined by (1), determined using (4), (5) and (6), accurately captures the points of maximum cooling COP. For example, in the chart 800 that relates to a cooling COP, the cooling current expressed by (1) indicates a COP 804-1 which is the maximum for the graph 804; a COP 806-1 which is the maximum for the graph 806; a COP 808-1 which is the maximum for the graph 808; a COP 810-1 which is the maximum for the graph 810; a COP 812-1 which is the maximum for the graph 812; a COP 814-1 which is the maximum for the graph 814; and a COP 816-1 which is the maximum for the graph 816.

Second, a heating case will be addressed. The heating case involves determining the heating current to use (e.g., an optimum heating current). For example, this can be the current corresponding to the maximum heating COP at a certain temperature difference between the module surfaces. An optimum heating current can be expressed as:

$$I\_opt\_h = max(I\_opt\_h\_pos, I\_opt\_h\_neg), \qquad (7)$$

where I_opt_h is the current corresponding to the maximum heating COP per module, I_opt_h_pos is the positive root of a quadratic equation, and I_opt_h_neg is the negative root of the quadratic equation. That is, the optimum heating current can be obtained by determining the two current expressions in (7) and taking the one that has the greater value. The arguments of (7) can be expressed as:

$$I\_opt\_h\_pos = \qquad (8)$$
$$(-b\_I\_opt\_h + sqrt((b\_I\_opt\_h^2) - (4*a\_I\_opt\_h*c\_I\_opt\_h)))$$
$$/(2*a\_I\_opt\_h), \text{ and}$$
$$I\_opt\_h\_neg = \qquad (9)$$
$$(-b\_I\_opt\_h + sqrt((b\_I\_opt\_h^2) - (4*a\_I\_opt\_h*c\_I\_opt\_h)))$$
$$/(2*a\_I\_opt\_h),$$

respectively. The term a_I_opt_h used in (8) and (9) can be referred to as a quadratic term and can be expressed as:

$$a\_I\_opt\_h = S\_coeff\_mod*R\_mod* \qquad (10)$$
$$(0.5*(t\_mod\_surf\_K\_h - t\_mod\_surf\_K\_c) - t\_mod\_surf\_K\_h)$$

where the terms have the meanings mentioned above.

The term b_I_opt_h used in (8) and (9) can be referred to as a linear term and can be expressed as:

$$b\_I\_opt\_h = \qquad (11)$$
$$2*R\_mod*K\_mod*(t\_mod\_surf\_K\_h - t\_mod\_surf\_K\_c),$$

where the terms have the meanings mentioned above.

The term c_I_opt_h used in (8) and (9) can be referred to as a constant term and can be expressed as:

$$c\_I\_opt\_h = \tag{12}$$
$$S\_coeff\_mod * K\_mod * ((t\_mod\_surf\_K\_h * t\_mod\_surf\_K\_c)^2),$$

where the terms have the meanings mentioned above.

The optimum heating current as defined by (7), determined using (10), (11) and (12), accurately captures the points of maximum heating COP. For example, in the chart 818 that relates to a heating COP, the heating current expressed by (7) indicates a COP 822-1 which is the maximum for the graph 822; a COP 824-1 which is the maximum for the graph 824; a COP 826-1 which is the maximum for the graph 826; a COP 828-1 which is the maximum for the graph 828; a COP 830-1 which is the maximum for the graph 830; a COP 832-1 which is the maximum for the graph 832; and a COP 834-1 which is the maximum for the graph 834.

Third, a combined case of cooling and heating will be addressed. For example, this can involve determining the current that maximizes the combined COP of heating and cooling at a certain temperature difference between the module surfaces. An optimum combined current can be expressed as:

$$I\_opt\_comb = \max(I\_opt\_comb\_pos, I\_opt\_comb\_neg), \tag{13}$$

where I_opt_comb is the current corresponding to the maximum combined COP per module, I_opt_comb_pos is the positive root of a quadratic equation, and I_opt_comb_neg is the negative root of the quadratic equation. That is, the optimum combined current can be obtained by determining the two current expressions in (13) and taking the one that has the greater value. The arguments of (13) can be expressed as:

$$I\_opt\_comb\_pos = (-b\_I\_opt\_comb + \tag{14}$$
$$sqrt((b\_I\_opt\_comb^2) - (4 * a\_I\_opt\_comb * c\_I\_opt\_comb)))$$
$$/(2 * a\_I\_opt\_comb), \text{ and}$$
$$I\_opt\_comb\_neg = (-b\_I\_opt\_comb + \tag{15}$$
$$sqrt((b\_I\_opt\_comb^2) - (4 * a\_I\_opt\_comb * c\_I\_opt\_comb)))$$
$$/(2 * a\_I\_opt\_comb),$$

respectively. The term a_I_opt_comb used in (14) and (15) can be referred to as a quadratic term and can be expressed as:

$$a\_I\_opt\_comb = \tag{16}$$
$$S\_coeff\_mod * R\_mod * (t\_mod\_surf\_K\_h + t\_mod\_surf\_K\_c),$$

where the terms have the meanings mentioned above.

The term b_I_opt_comb used in (14) and (15) can be referred to as a linear term and can be expressed as:

$$b\_I\_opt\_comb = \tag{17}$$
$$4 * R\_mod * K\_mod(t\_mod\_surf\_K\_h - t\_mod\_surf\_K\_c),$$

where the terms have the meanings mentioned above.

The term c_I_opt_comb used in (14) and (15) can be referred to as a constant term and can be expressed as:

$$c\_I\_opt\_comb = -2 * S\_coeff\_mod * \tag{18}$$
$$K\_mod * ((t\_mod\_surf\_K\_h - t\_mod\_surf\_K\_c)^2),$$

where the terms have the meanings mentioned above.

The optimum current as defined by (13), determined using (16), (17) and (18), accurately captures the points of maximum combined COP. For example, in the chart 842 that relates to a combined COP, the current expressed by (13) indicates a COP 846-1 which is the maximum for the graph 846; a COP 848-1 which is the maximum for the graph 848; a COP 850-1 which is the maximum for the graph 850; a COP 852-1 which is the maximum for the graph 852; a COP 854-1 which is the maximum for the graph 854; a COP 856-1 which is the maximum for the graph 856; and a COP 858-1 which is the maximum for the graph 858.

Figures 9A, 9B:
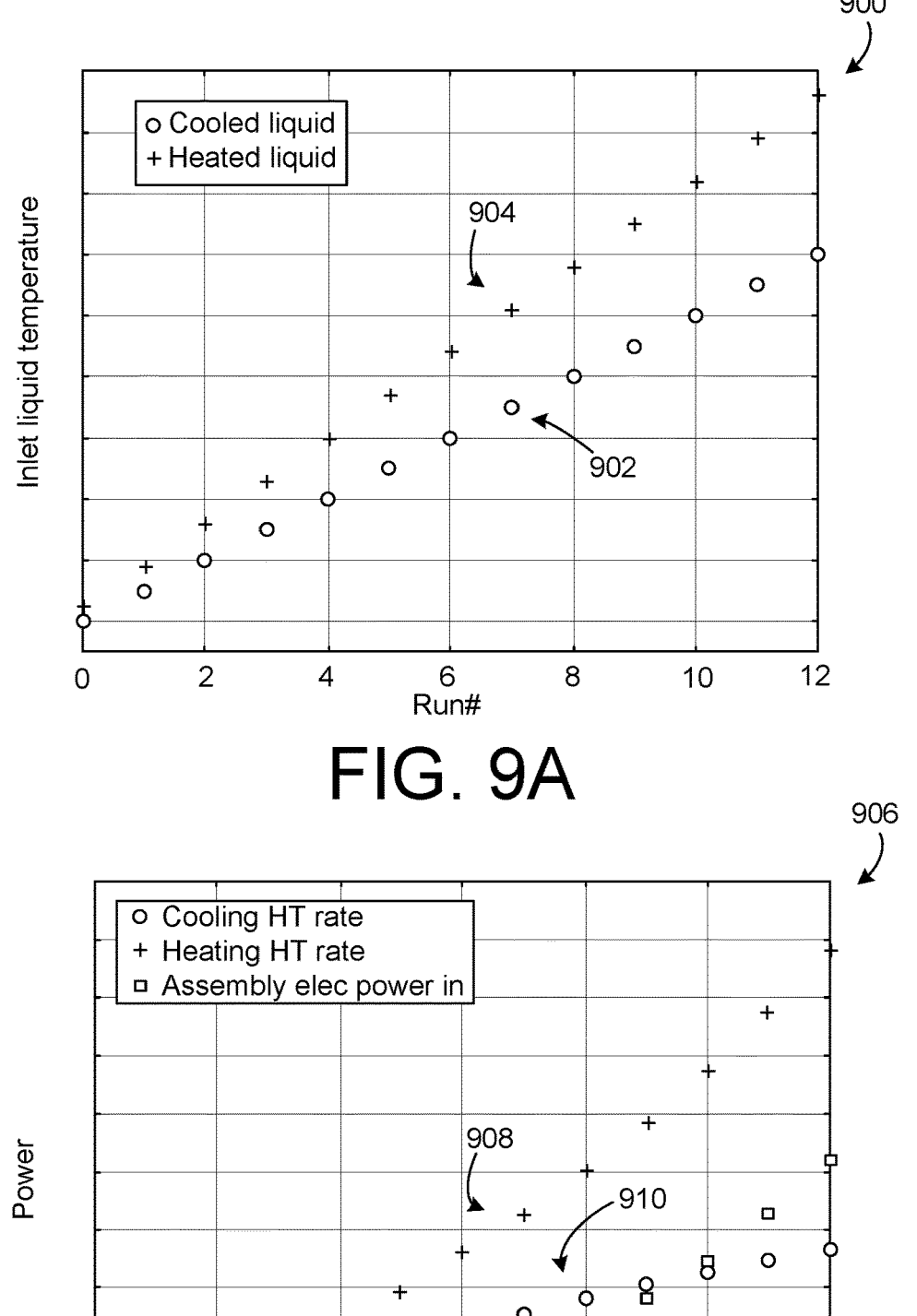
FIGS. 9A-9C show examples of temperatures, power, and COP for multiple runs involving heat transfer between two liquids that gradually increase in temperature.
Figure 9C:
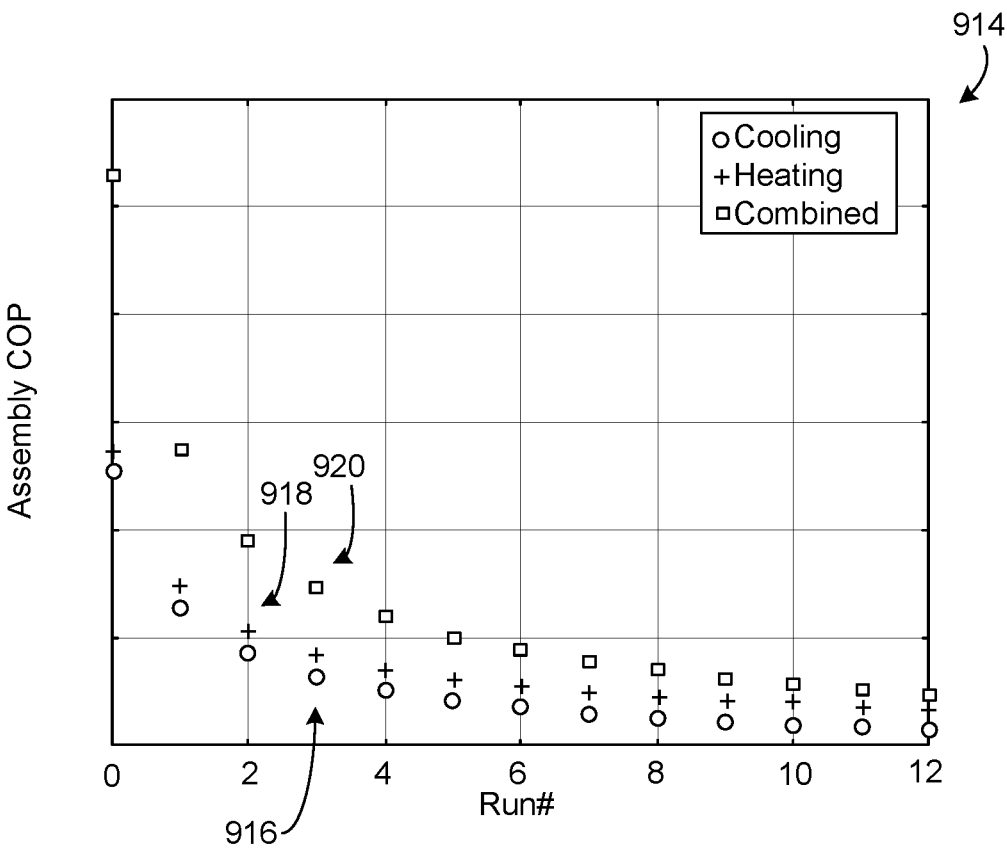

FIGS. 9A-9C show examples of temperatures, power, and COP for multiple runs involving heat transfer between two liquids that gradually increase in temperature. The runs were simulated according to an implementation of the present subject matter. These characteristics can be applicable to one or more other examples described elsewhere herein. In FIG. 9A, the inlet liquid temperatures are indicated against a vertical axis of a chart 900 where the different runs (e.g., respective examples) are identified on a horizontal axis. A graph 902 indicates temperature of a cooled liquid (e.g., a powertrain liquid), and a graph 904 indicates temperature of a heated liquid (e.g., a coolant for a cabin thermal loop). For example, the chart 900 can illustrate the situation of a vehicle starting from a so-called cold soak (e.g., with an ambient temperature of about-10 degrees C., wherein both liquids heat up as the vehicle starts).

FIG. 9B shows a chart 906 that indicates the variations in the respective powers of the system against a vertical axis for different runs on a horizontal axis. The powers include a heating heat transfer rate in a graph 908, a cooling heat transfer rate in a graph 910, and an electrical power input for the assembly in a graph 912. FIG. 9C shows a chart 914 that indicates the COPs of the assembly against a vertical axis for different runs on a horizontal axis. The COPs include a cooling COP in a graph 916, a heating COP in a graph 918, and a combined COP in a graph 920.

The charts 900, 906 and 914 show that the COPs are high at low liquid/ambient temperatures. For example, these are conditions where a heat pump typically suffers from low capacity. The charts 900, 906 and 914 also show that the heating capacity of the assembly may be low at low liquid/ambient temperatures, mainly because of a low current. This can be addressed by using an assembly with more thermoelectric modules, and/or by operating the assembly at a current higher than the optimum heating current. For example, this approach can involve sacrificing a little of the COP to obtain more capacity. Generally, implementations of the present subject matter can at all times obtain a heating COP that is superior to that of an electric heater. For example, a heating COP of more than about 1.5 can be obtained at all times. As another example, a combined COP greater than about 2 can be obtained at all times.

Figures 10A, 10B:
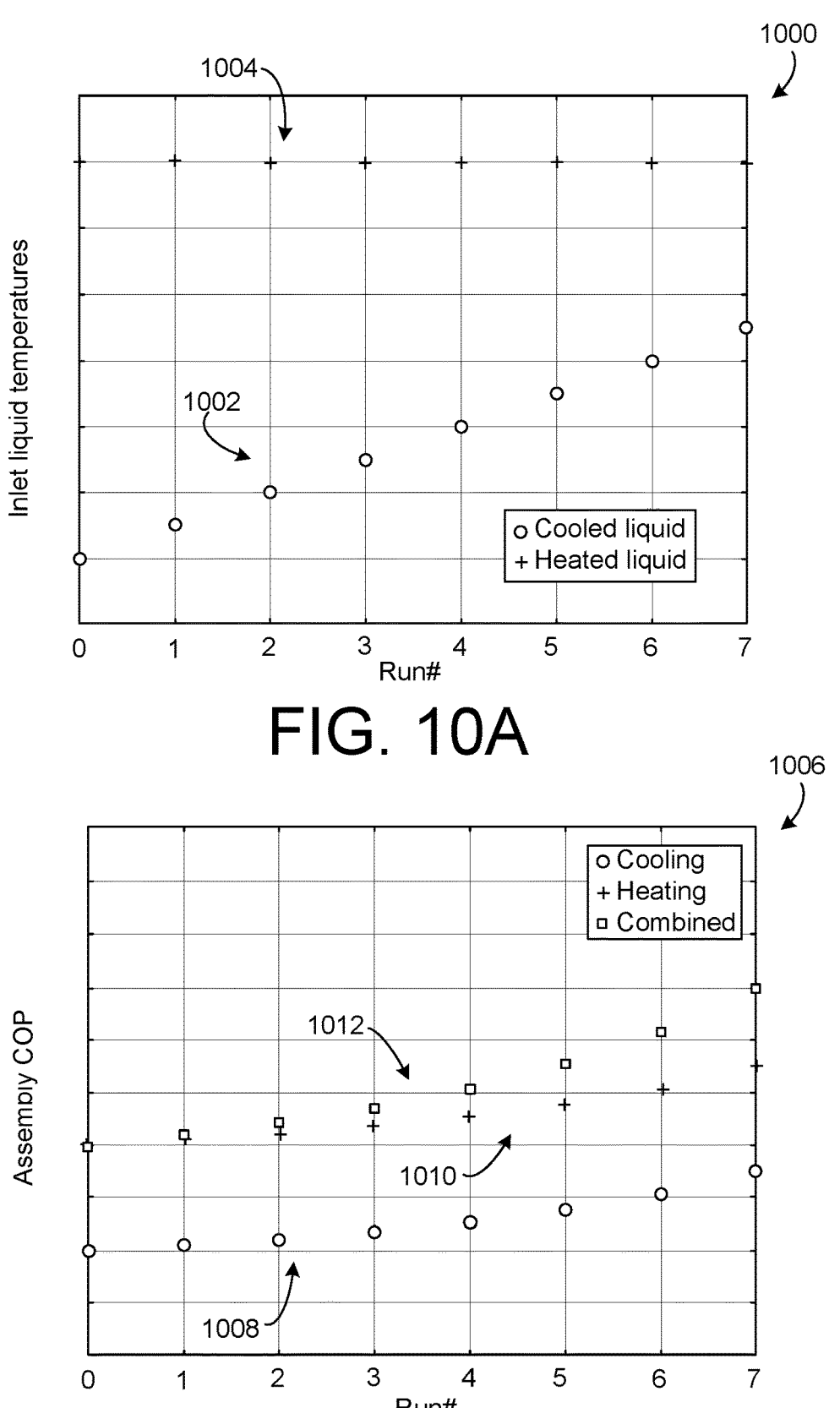
FIGS. 10A-10D show examples of temperatures, assembly COP, power, and heating COP for multiple runs involving heat transfer from a varying-temperature liquid to a constant-temperature liquid.

FIGS. 10A-10D show examples of temperatures, assembly COP, power, and heating COP for multiple runs involving heat transfer from a varying-temperature liquid to a constant-temperature liquid. The runs were simulated according to an implementation of the present subject matter. These characteristics can be applicable to one or more other examples described elsewhere herein. In FIG. 10A, the inlet liquid temperatures are indicated against a vertical axis of a chart 1000 where the different runs (e.g., respective examples) are identified on a horizontal axis. A graph 1002 indicates temperature of a cooled liquid (e.g., a powertrain liquid), and a graph 1004 indicates temperature of a heated liquid (e.g., a coolant for a cabin thermal loop). The chart 1000 can illustrate a heating scenario against a constant heat sink temperature and with a varying heat source temperature. For example, this can illustrate the situation of providing heat at a constant temperature but under different ambient conditions.

Figures 10C, 10D:
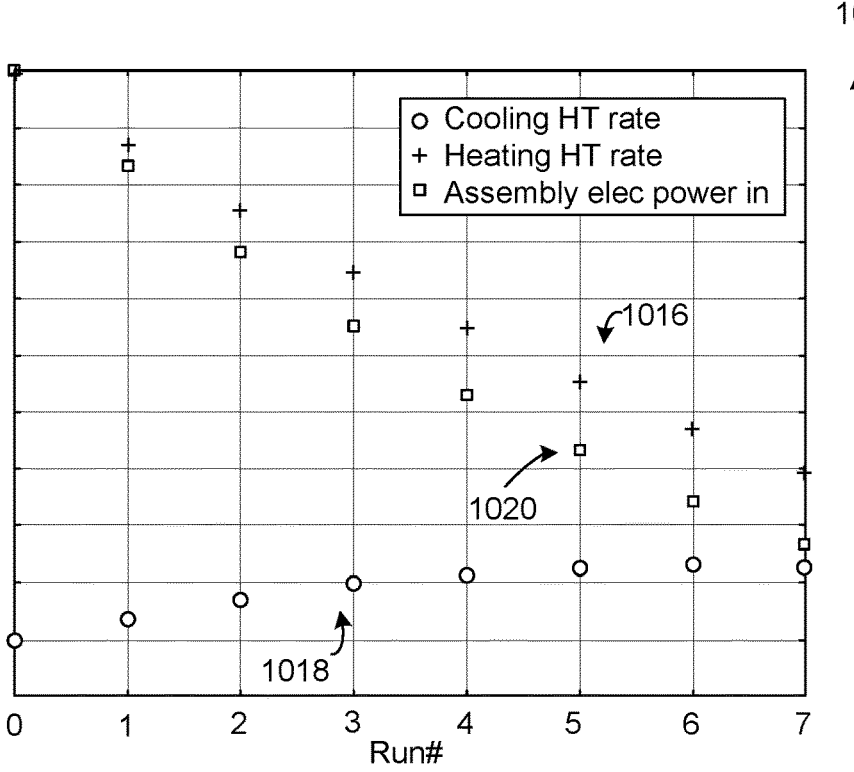

FIG. 10B shows a chart 1006 that indicates the COPs of the assembly against a vertical axis for different runs on a horizontal axis. The COPs include a cooling COP in a graph 1008, a heating COP in a graph 1010, and a combined COP in a graph 1012. FIG. 10C shows a chart 1014 that indicates the variations in the respective powers of the system against a vertical axis for different runs on a horizontal axis. The powers include a heating heat transfer rate in a graph 1016, a cooling heat transfer rate in a graph 1018, and an electrical power input for the assembly in a graph 1020. FIG. 10D shows a chart 1022 that indicates the heating COP against a vertical axis for different cold fluid temperature (i.e., the heat source temperature) runs on a horizontal axis. The heating COP for the thermoelectric assembly is shown in a graph 1024.

The charts 1000, 1006, 1014, and 1022 show that the heating COP of the assembly is greater than or equal to one in all of the runs. This applies also at low ambient or cooled liquid temperatures (or heat source temperatures). The assembly COP increases with the temperature of the heat source, that is, as the temperature difference decreases. For example, this may be similar to the performance of a heat pump. At a cooled liquid temperature of about −20 C the $COP_h$ is one. For example, this may be similar to the performance of a heat pump. While a heat pump may provide higher COPs at higher heat source temperatures, the thermoelectric assembly provides a high heating capacity at the lowest heat source temperature (i.e., cooled liquid temperature). This is a condition where the heat pump suffers from low capacity because of the low refrigerant density at the compressor inlet.

Figure 11:
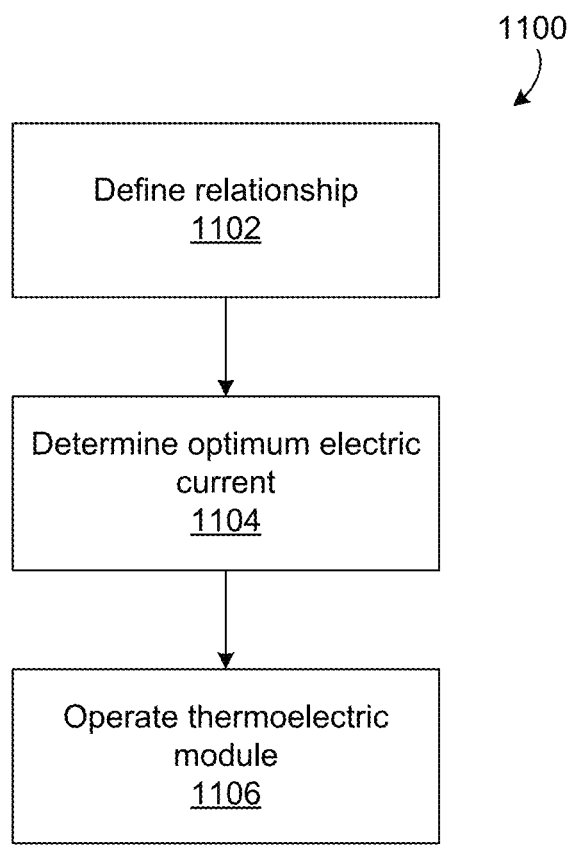
FIG. 11 shows an example of a method.

FIG. 11 shows an example of a method 1100. The method 1100 can be used with one or more other examples described elsewhere herein. More or fewer operations than shown can be performed. Two or more operations can be performed in a different order unless otherwise indicated.

In operation 1102, a relationship can be defined between a COP and current for a thermoelectric module of a device. For example, the relationship can be (1), (7), and/or (13), as discussed above. The device further includes i) a first fluid channel defining a first flow direction for a first fluid, the first fluid channel including first features that interact with the first fluid, and ii) a second fluid channel defining a second flow direction for a second fluid, the second fluid channel including second features that interact with the second fluid. For example, the device can include the fluid channel 108A, 108B, 502A, and/or 600. The thermoelectric module is sandwiched between the first and second fluid channels in the device and is thermally coupled to each of the first and second fluids (e.g., the thermoelectric module 102, 302-1, 302-m, and/or 302-n).

In operation 1104, an optimum electric current for the thermoelectric module can be determined using the relationship. For example, the electric current corresponding to any of the COPs 804-1, 806-1, 808-1, 810-1, 812-1, 814-1, 816-1, 822-1, 824-1, 826-1, 828-1, 830-1, 832-1, 834-1, 846-1, 848-1, 850-1, 852-1, 854-1, 856-1, or 858-1, can be determined.

In operation 1106, the thermoelectric module can be operated substantially at the optimum electric current. For example, this approach can obtain a high COP in heating and/or cooling by harnessing the benefits of thermoelectric modules while overcoming their limitations.

The following are further examples relating to the present subject matter. Each of the examples is referred to as a "clause" for identification.

Clause 1. A device comprising: a first thermoelectric module; a second thermoelectric module; and a first fluid channel for a first fluid, the first fluid channel sandwiched between the first and second thermoelectric modules, the first fluid channel including first barriers.

Clause 2. The device of Clause 1, further comprising a second fluid channel including second barriers, the second fluid channel positioned against the first thermoelectric module on an opposite side from the first fluid channel.

Clause 3. The device of Clause 2, wherein the first fluid channel defines a first flow direction, and wherein the second fluid channel defines a second flow direction.

Clause 4. The device of Clause 3, wherein the first barriers extend substantially perpendicular to the first flow direction, and wherein the second barriers extend substantially perpendicular to the second flow direction.

Clause 5. The device of Clause 3, wherein the first fluid channel is oriented so that the first flow direction is substantially aligned with the second flow direction.

Clause 6. The device of Clause 3, wherein the first fluid channel is oriented so that the first flow direction is opposite to the second flow direction.

Clause 7. The device of Clause 3, wherein the first fluid channel is oriented so that the first flow direction is substantially perpendicular to the second flow direction.

Clause 8. The device of Clause 3, wherein the device comprises multiple thermoelectric modules each having a corresponding first fluid channel and a corresponding second fluid channel, the multiple thermoelectric modules arranged in a planar m*n grid that includes m=1, 2, 3, . . . of the multiple thermoelectric modules situated along a first direction, and n=1, 2, 3, . . . of the multiple thermoelectric modules situated along a second direction perpendicular to the first direction.

Clause 9. The device of Clause 8, wherein on a first side of the multiple thermoelectric modules each of the corresponding first fluid channels are oriented in the first flow direction, and on a second side of the multiple thermoelectric modules opposite to the first side each of the corresponding second fluid channels are oriented in the second flow direction.

Clause 10. The device of Clause 9, wherein the corresponding first fluid channels are oriented so that the first flow direction is substantially aligned with the second flow direction.

Clause 11. The device of Clause 10, wherein the first flow direction is opposite to the second flow direction.

Clause 12. The device of Clause 9, wherein the corresponding first fluid channels are oriented so that the first flow direction is substantially perpendicular to the second flow direction.

Clause 13. The device of Clause 9, wherein the device comprises multiple planar m*n grids that are sandwiched with each other in a three-dimensional m*n*p grid, the three-dimensional m*n*p grid including p=1, 2, 3, . . . of the planar m*n grids.

Clause 14. The device of Clause 13, wherein in a first planar m*n grid the corresponding first fluid channels are oriented so that the first flow direction is substantially parallel to the first fluid channels of at least a second planar m*n grid.

Clause 15. The device of Clause 14, wherein the first flow direction of the first planar m*n grid is opposite to the first flow direction of the second planar m*n grid.

Clause 16. The device of Clause 13, wherein the corresponding first fluid channels of a first planar m*n grid are oriented so that the first flow direction is substantially perpendicular to the corresponding first fluid channels of at least a second planar m*n grid.

Clause 17. The device of Clause 3, wherein at least the first barriers comprise offset strip fins.

Clause 18. The device of Clause 17, wherein each of the offset strip fins comprises ridges each defining a corresponding passage that is substantially perpendicular to the first flow direction, the ridges arranged in multiple rows, wherein first ridges in a first row abut, and are offset along the first flow direction from, second ridges in a second row.

Clause 19. The device of Clause 3, wherein at least the first barriers are arranged in rows that are substantially perpendicular to the first flow direction, each row including multiple barriers that are spaced from each other to form openings.

Clause 20. The device of Clause 19, wherein a first barrier in a first row is offset, along a direction of the first row, from a second barrier in a second row, the second row adjacent to the first row.

Clause 21. The device of Clause 20, wherein a third barrier in a third row is aligned with the first barrier, along the direction of the first row, the third row adjacent to the second row on a side opposite to the first row.

Clause 22. The device of Clause 2, wherein the first barriers have substantially a common shape with the second barriers.

Clause 23. The device of Clause 1, wherein the first fluid comprises at least one selected from the group consisting of liquid, water, glycol, refrigerant, gas, air, oxygen, nitrogen, carbon dioxide, and oil.

Clause 24. A method comprising: defining a relationship involving a coefficient of performance (COP) and current for a thermoelectric module of a device, the device further including i) a first fluid channel defining a first flow direction for a first fluid, the first fluid channel including first features that interact with the first fluid, and ii) a second fluid channel defining a second flow direction for a second fluid, the second fluid channel including second features that interact with the second fluid, wherein the thermoelectric module is sandwiched between the first and second fluid channels in the device, and is thermally coupled to each of the first and second fluids; determining, using the relationship, an optimum electric current for the thermoelectric module, the optimum electric current corresponding to an optimum COP of the thermoelectric module; and operating the thermoelectric module substantially at the optimum electric current.

Clause 25. The method of Clause 24, wherein the relationship includes that the COP is defined as a cooling heat transfer rate divided by input electric power to the thermoelectric module.

Clause 26. The method of Clause 24, wherein the relationship includes that the COP is defined as a heating heat transfer rate divided by input electric power to the thermoelectric module.

Clause 27. The method of Clause 24, wherein the relationship includes that the COP is defined as a sum of a cooling heat transfer rate and a heating heat transfer rate, the sum divided by input electric power to the thermoelectric module.

Clause 28. The method of Clause 24, wherein determining the optimum electric current comprises applying a maximum function to a first current expression and a second current expression.

Clause 29. The method of Clause 28, wherein the first current expression comprises a first root of a first quadratic equation, and wherein the second current expression comprises a second root of a second quadratic equation.

Clause 30. The method of Clause 29, wherein a quadratic term of at least one of the first or second roots includes:
a Seebeck coefficient of the thermoelectric module;
a resistance of the thermoelectric module;
a surface temperature of a hot side of the thermoelectric module; and
a surface temperature of a cold side of the thermoelectric module.

Clause 31. The method of Clause 29, wherein a linear term of at least one of the first or second roots includes:
a resistance of the thermoelectric module;
a thermal conductance of the thermoelectric module;
a surface temperature of a hot side of the thermoelectric module; and
a surface temperature of a cold side of the thermoelectric module.

Clause 32. The method of Clause 29, wherein a constant term of at least one of the first or second roots includes:
a Seebeck coefficient of the thermoelectric module;
a thermal conductance of the thermoelectric module;
a surface temperature of a hot side of the thermoelectric module; and
a surface temperature of a cold side of the thermoelectric module.

Clause 33. The method of Clause 28, wherein the first and second current expressions apply to a hot side of the thermoelectric module.

Clause 33. The method of Clause 28, wherein the first and second current expressions apply to a cold side of the thermoelectric module.

Clause 33. The method of Clause 28, wherein the first and second current expressions apply to a combined COP of a hot side of the thermoelectric module and a cold side of the thermoelectric module.

The terms "substantially" and "about" used throughout this Specification are used to describe and account for small fluctuations, such as due to variations in processing. For example, they can refer to less than or equal to +5%, such as less than or equal to +2%, such as less than or equal to +1%, such as less than or equal to +0.5%, such as less than or equal to +0.2%, such as less than or equal to +0.1%, such as less than or equal to +0.05%. Also, when used herein, an indefinite article such as "a" or "an" means "at least one."

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

A number of implementations have been described. Nevertheless, it will be understood that various modifications may be made without departing from the spirit and scope of the specification.

In addition, the logic flows depicted in the figures do not require the particular order shown, or sequential order, to achieve desirable results. In addition, other processes may be provided, or processes may be eliminated, from the described flows, and other components may be added to, or removed from, the described systems. Accordingly, other implementations are within the scope of the following claims.

While certain features of the described implementations have been illustrated as described herein, many modifications, substitutions, changes and equivalents will now occur to those skilled in the art. It is, therefore, to be understood that appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A device comprising:
   a first fluid channel for a first fluid, the first fluid channel including first barriers;
   a second fluid channel for a second fluid, the second fluid channel including second barriers; and
   a thermoelectric module between the first and second fluid channels, the thermoelectric module thermally coupled to each of the first and second fluid channels;
   wherein the first fluid channel defines a first flow direction, and wherein the second fluid channel defines a second flow direction, wherein at least the first barriers comprise offset strip fins, wherein each of the offset strip fins comprises ridges each defining a corresponding passage extending through the ridge, the passage substantially perpendicular to the first flow direction, the ridges arranged in multiple rows, wherein first ridges in a first row abut, and are offset along the first flow direction from, second ridges in a second row.

2. The device of claim 1, wherein the first barriers extend substantially perpendicular to the first flow direction, and wherein the second barriers extend substantially perpendicular to the second flow direction.

3. The device of claim 1, wherein the first fluid channel is oriented so that the first flow direction is substantially aligned with the second flow direction.

4. The device of claim 3, wherein the first fluid channel is oriented so that the first flow direction is opposite to the second flow direction.

5. The device of claim 1, wherein the first fluid channel is oriented so that the first flow direction is substantially perpendicular to the second flow direction.

6. The device of claim 1, wherein the device comprises multiple thermoelectric modules each having a corresponding first fluid channel and a corresponding second fluid channel, the multiple thermoelectric modules arranged in a planar m*n grid that includes m=1, 2, 3, . . . of the multiple thermoelectric modules situated along a first direction, and n=1, 2, 3, . . . of the multiple thermoelectric modules situated along a second direction perpendicular to the first direction.

7. The device of claim 6, wherein on a first side of the multiple thermoelectric modules each of the corresponding first fluid channels are oriented in the first flow direction, and on a second side of the multiple thermoelectric modules opposite to the first side each of the corresponding second fluid channels are oriented in the second flow direction.

8. The device of claim 7, wherein the corresponding first fluid channels are oriented so that the first flow direction is substantially aligned with the second flow direction.

9. The device of claim 8, wherein the first flow direction is opposite to the second flow direction.

10. The device of claim 7, wherein the corresponding first fluid channels are oriented so that the first flow direction is substantially perpendicular to the second flow direction.

11. The device of claim 7, wherein the device comprises multiple planar m*n grids that are sandwiched with each other in a three-dimensional m*n*p grid, the three-dimensional m*n*p grid including p=1, 2, 3, . . . of the planar m*n grids.

12. The device of claim 11, wherein in a first three-dimensional m*n*p grid the corresponding first fluid channels are oriented so that the first flow direction is substantially parallel to the first fluid channels of at least a second three-dimensional m*n*p grid.

13. The device of claim 12, wherein the first flow direction of the first three-dimensional m*n*p grid is opposite to the first flow direction of the second three-dimensional m*n*p grid.

14. The device of claim 11, wherein the corresponding first fluid channels of a first three-dimensional m*n*p grid are oriented so that the first flow direction is substantially perpendicular to the corresponding first fluid channels of at least a second three-dimensional m*n*p grid.

15. The device of claim 1, wherein at least the first barriers are arranged in rows that are substantially perpendicular to the first flow direction, each row including multiple barriers that are spaced from each other to form openings.

16. The device of claim 15, wherein a first barrier in a first row is offset, along a direction of the first row, from a second barrier in a second row, the second row adjacent to the first row.

17. The device of claim 16, wherein a third barrier in a third row is aligned with the first barrier, along the direction of the first row, the third row adjacent to the second row on a side opposite to the first row.

18. The device of claim 1, wherein at least one of the first or second fluids comprises at least one selected from the group consisting of liquid, water, glycol, refrigerant, gas, air, oxygen, nitrogen, carbon dioxide, and oil.

19. The device of claim 1, wherein the first barriers have substantially a common shape with the second barriers.

20. The device of claim 1, wherein the thermoelectric module is a first thermoelectric module, the device further comprising a second thermoelectric module between the first and second fluid channels, the second thermoelectric module abutting the first thermoelectric module, wherein the first and second thermoelectric modules are both thermally coupled to each of the first and second fluid channels.

* * * * *